United States Patent
Shelnutt et al.

(10) Patent No.: US 10,331,144 B2
(45) Date of Patent: Jun. 25, 2019

(54) LIQUID FLOW CONTROL MANAGEMENT FOR SHARED INFRASTRUCTURE SERVERS

(71) Applicant: DELL PRODUCTS, L.P., Round Rock, TX (US)

(72) Inventors: Austin Michael Shelnutt, Leander, TX (US); Paul W. Vancil, Austin, TX (US); John R. Stuewe, Round Rock, TX (US); Charles Edward Smith, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 151 days.

(21) Appl. No.: 15/017,604

(22) Filed: Feb. 6, 2016

(65) Prior Publication Data

US 2017/0177007 A1 Jun. 22, 2017

Related U.S. Application Data

(60) Provisional application No. 62/270,584, filed on Dec. 22, 2015, provisional application No. 62/270,574, filed on Dec. 21, 2015, provisional application No. 62/270,563, filed on Dec. 21, 2015.

(51) Int. Cl.
| | |
|---|---|
| *G05D 7/00* | (2006.01) |
| *G05B 13/00* | (2006.01) |
| *G05D 7/06* | (2006.01) |
| *G05B 15/02* | (2006.01) |
| *H05K 7/20* | (2006.01) |

(52) U.S. Cl.
CPC ........... *G05D 7/0629* (2013.01); *G05B 15/02* (2013.01); *H05K 7/20736* (2013.01); *H05K 7/20772* (2013.01); *H05K 7/20781* (2013.01); *H05K 7/20836* (2013.01)

(58) Field of Classification Search
CPC .................................... G05D 7/0635
USPC ......................................... 700/282
See application file for complete search history.

(56) References Cited

U.S. PATENT DOCUMENTS

| | | | |
|---|---|---|---|
| 5,758,607 A | 6/1998 | Brendel et al. | |
| 6,462,949 B1 | 10/2002 | Parish et al. | |
| 6,574,104 B2 * | 6/2003 | Patel .................. | H05K 7/20745 165/104.33 |
| 6,775,137 B2 | 8/2004 | Chu et al. | |

(Continued)

OTHER PUBLICATIONS

Dravininkas, Adam B., Restriction Requirement, U.S. Appl. No. 15/049,074, The United States Patent and Trademark Office, dated Jul. 13, 2017.

(Continued)

*Primary Examiner* — Suresh Suryawanshi
(74) *Attorney, Agent, or Firm* — Isidore PLLC

(57) ABSTRACT

A computer-implemented method controls liquid cooling of a direct injection liquid-cooled (DL) rack information handling system (RIHS). The method includes receiving, at a liquid cooling control subsystem, an incoming cooling liquid supply flow rate corresponding to an incoming cooling liquid supply being supplied to the DL RIHS. A maximum flow rate cap is calculated for each of the LC nodes. The maximum flow rate cap is transmitted to a controller for each of the LC nodes. The controller triggers each of the LC nodes to adjust the associated flow rate for that LC node to correspond to the received maximum flow rate cap for that node.

18 Claims, 22 Drawing Sheets

(56) References Cited

U.S. PATENT DOCUMENTS

| | | | |
|---|---|---|---|
| 7,013,955 B2 | 3/2006 | Phillips et al. | |
| 7,106,590 B2 | 9/2006 | Chu et al. | |
| 7,403,384 B2 | 7/2008 | Pflueger | |
| 7,657,347 B2* | 2/2010 | Campbell | G01F 1/6965 |
| | | | 137/340 |
| 7,944,694 B2 | 5/2011 | Campbell et al. | |
| 7,963,119 B2 | 6/2011 | Campbell et al. | |
| 7,990,709 B2* | 8/2011 | Campbell | H05K 7/20745 |
| | | | 165/104.33 |
| 8,387,249 B2 | 3/2013 | Campbell et al. | |
| 8,405,975 B2 | 3/2013 | Helberg et al. | |
| 8,422,218 B2 | 4/2013 | Fried et al. | |
| 8,516,284 B2 | 8/2013 | Chan et al. | |
| 8,564,951 B1 | 10/2013 | Watanabe et al. | |
| 8,583,290 B2 | 11/2013 | Campbell et al. | |
| 8,749,968 B1 | 6/2014 | Branton | |
| 8,797,740 B2 | 8/2014 | Campbell et al. | |
| 8,824,143 B2 | 9/2014 | Campbell et al. | |
| 8,842,433 B2 | 9/2014 | Koblenz et al. | |
| 8,934,244 B2 | 1/2015 | Shelnutt et al. | |
| 8,978,401 B2 | 3/2015 | Chainer et al. | |
| 9,045,995 B2 | 6/2015 | Graybill et al. | |
| 9,069,532 B2 | 6/2015 | Campbell et al. | |
| 9,250,636 B2 | 2/2016 | Chainer et al. | |
| 9,386,727 B2 | 7/2016 | Barringer et al. | |
| 9,451,726 B2 | 9/2016 | Regimbal et al. | |
| 9,496,200 B2 | 11/2016 | Lyon et al. | |
| 9,521,787 B2* | 12/2016 | Chainer | H05K 7/20836 |
| 2004/0190247 A1 | 9/2004 | Chu et al. | |
| 2004/0221604 A1 | 11/2004 | Ota et al. | |
| 2005/0248922 A1 | 11/2005 | Chu et al. | |
| 2008/0067805 A1 | 3/2008 | Kamada et al. | |
| 2008/0232064 A1 | 9/2008 | Sato et al. | |
| 2008/0276639 A1 | 11/2008 | Stoddard | |
| 2009/0086428 A1 | 4/2009 | Campbell et al. | |
| 2009/0086432 A1 | 4/2009 | Campbell et al. | |
| 2009/0126909 A1 | 5/2009 | Ellsworth et al. | |
| 2009/0154096 A1 | 6/2009 | Iyengar et al. | |
| 2009/0165868 A1 | 7/2009 | Pearson | |
| 2009/0259343 A1* | 10/2009 | Rasmussen | H05K 7/2079 |
| | | | 700/282 |
| 2009/0262501 A1 | 10/2009 | Claassen et al. | |
| 2010/0032142 A1* | 2/2010 | Copeland | G05D 23/1925 |
| | | | 165/104.33 |
| 2010/0103614 A1 | 4/2010 | Campbell et al. | |
| 2010/0103618 A1 | 4/2010 | Campbell et al. | |
| 2011/0060470 A1* | 3/2011 | Campbell | G05D 23/1934 |
| | | | 700/282 |
| 2011/0075373 A1 | 3/2011 | Campbell et al. | |
| 2011/0083621 A1 | 4/2011 | Ogunleye et al. | |
| 2011/0112694 A1* | 5/2011 | Bash | F24F 11/0001 |
| | | | 700/277 |
| 2011/0313576 A1 | 12/2011 | Nicewonger | |
| 2012/0180979 A1 | 7/2012 | Harrington | |
| 2013/0098085 A1* | 4/2013 | Judge | H05K 7/20827 |
| | | | 62/180 |
| 2013/0106265 A1 | 5/2013 | Shelnutt et al. | |
| 2013/0112378 A1 | 5/2013 | Shelnutt et al. | |
| 2013/0128455 A1* | 5/2013 | Koblenz | H05K 7/20836 |
| | | | 361/692 |
| 2013/0229769 A1 | 9/2013 | Yang | |
| 2013/0264046 A1* | 10/2013 | Chainer | G06F 1/206 |
| | | | 165/287 |
| 2013/0312839 A1 | 11/2013 | Shelnutt et al. | |
| 2013/0312846 A1 | 11/2013 | Eriksen et al. | |
| 2013/0312854 A1 | 11/2013 | Eriksen et al. | |
| 2014/0202678 A1 | 7/2014 | Goth et al. | |
| 2014/0203550 A1 | 7/2014 | Utsch | |
| 2014/0218859 A1 | 8/2014 | Shelnutt et al. | |
| 2014/0321056 A1 | 10/2014 | Yoshikawa et al. | |
| 2014/0328562 A1 | 11/2014 | Pitwon | |
| 2015/0109735 A1 | 4/2015 | Campbell et al. | |
| 2015/0233597 A1 | 8/2015 | Dempster et al. | |
| 2015/0334878 A1 | 11/2015 | Long et al. | |
| 2016/0066480 A1 | 3/2016 | Eckberg et al. | |
| 2016/0242319 A1 | 8/2016 | Edwards et al. | |
| 2016/0242326 A1 | 8/2016 | Edwards et al. | |
| 2016/0366792 A1 | 12/2016 | Smith et al. | |
| 2017/0049009 A1 | 2/2017 | Steinke et al. | |
| 2017/0181322 A1 | 6/2017 | Shelnutt et al. | |
| 2017/0181323 A1 | 6/2017 | Shelnutt et al. | |

OTHER PUBLICATIONS

Ahmad, Yahya A., Non-Final Office Action, U.S. Appl. No. 15/016,226, The United States Patent and Trademark Office, dated Apr. 7, 2017.

Brown, Robert D., Notice of Allowance, U.S. Appl. No. 15/017,582, The United States Patent and Trademark Office, dated Jun. 13, 2017.

Dravininkas, Adam B., Non-Final Office Action, U.S. Appl. No. 15/016,249, The United States Patent and Trademark Office, dated Jun. 20, 2017.

Brown, Michael J., Non-Final Office Action, U.S. Appl. No. 15/016,234, The United States Patent and Trademark Office, dated Mar. 30, 2018.

Dravininkas, Adam B., Notice of Allowance, U.S. Appl. No. 15/016,249, The United States Patent and Trademark Office, dated Feb. 26, 2018.

Dravininkas, Adam, Ex Parte Quayle Action, U.S. Appl. No. 15/016,249, The United States Patent and Trademark Office, Oct. 24, 2017.

Dravininkas, Adam, Non-Final Office Action, U.S. Appl. No. 15/049,074, The United States Patent and Trademark Office, dated Nov. 14, 2017.

Suryawanshi, Suresh, Non-Final Office Action, U.S. Appl. No. 15/017,451, The United States Patent and Trademark Office, dated Dec. 14, 2017.

Suryawanshi, Suresh, Non-Final Office Action, U.S. Appl. No. 15/017,492, The United States Patent and Trademark Office, dated Nov. 3, 2017.

* cited by examiner

LIQUID FLOW CONTROL MANAGEMENT FOR SHARED INFRASTRUCTURE SERVERS

PRIORITY

The present invention claims priority from each of the following provisional patent applications, with relevant content of each listed provisional application incorporated herein by reference: Provisional Application Ser. No.: 62/270,563, with filing date Dec. 21, 2015; Provisional Application Ser. No. 62/270,584, with filing date Dec. 22, 2015; and Provisional Application Ser. No. 62/270,574, with filing date Dec. 21, 2015.

BACKGROUND

1. Technical Field

The present disclosure generally relates to information handling systems (IHS), and more particular to a direct-injection liquid cooled (DL) rack-configured IHS (RIHS), having a liquid cooling subsystem and liquid-cooled nodes. Still more particularly, the disclosure is related to liquid flow control management for shared infrastructure servers in a RIHS.

2. Description of the Related Art

As the value and use of information continue to increase, individuals and businesses seek additional ways to process and store information. One option available to users are Information Handling Systems (IHSs). An IHS generally processes, compiles, stores, and/or communicates information or data for business, personal, or other purposes, thereby allowing users to take advantage of the value of the information. Given that technology and information handling needs and requirements vary between users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

For implementations requiring a large amount of processing capability, a rack-configured (or rack) IHS (RIHS) can be provided. The RIHS includes a physical rack, within which is inserted a plurality of functional nodes, such as server (or processing) nodes/modules, storage nodes, and power supply nodes. These nodes, and particularly the server nodes, typically include processors and other functional components that dissipate heat when operating and/or when connected to a power supply. Efficient removal of the heat being generated by these components is required to maintain the operational integrity of the RIHS. Traditional heat removal systems include use of air movers, such as fans, to provide convective heat transfer from inside of the RIHS to outside the RIHS. More recently, some RIHS have been designed to enable submersion of the server modules and/or the heat generating components in a tank of cooling liquid to effect cooling via absorption of the heat by the surrounding immersion liquid.

The amount of processing capacity and storage capacity per node and/or per rack continues to increase, providing greater heat dissipation per node, and requiring more specific cooling solutions. Thus, there is a continuing need for further innovations to provide directed cooling for the individual heat generating components, both at the individual node level, as well as at the larger rack level. When designing the cooling subsystem, consideration must also be given to the different form factors of IT nodes and rack heights of the RIHS, and the ability to effectively control cooling discretely (at device or node level) and generally across the overall RIHS.

BRIEF SUMMARY

The illustrative embodiments of the present disclosure provide a direct-injection liquid cooled (DL) rack information handling system (RIHS), a liquid cooling system and a computer-implemented method that enables a liquid flow control management for shared infrastructure servers of a RIHS. According to one embodiment, a computer-implemented method for controlling liquid cooling of liquid-cooled (LC) nodes in a DL RIHS is disclosed. The method includes receiving, at a rack-level liquid flow infrastructure controller (LIC) of a liquid cooling control subsystem, an incoming cooling liquid supply flow rate corresponding to an incoming amount of cooling liquid being supplied to the DL RIHS. The method also includes calculating a maximum flow rate cap for each block of LC nodes. The maximum flow rate cap for each block of LC nodes is transmitted to a respective block controller. The block controller can adjust the associated flow rate of cooling liquid for that block of LC nodes to correspond to the received maximum flow rate cap for that block.

According to one aspect, the rack-level controller or block-level controller receives an input that identifies a highest temperature generated by the different processors of the LC nodes within each block, and the block level controller moderates the actual flow rate of the respective block to allow for adequate cooling of the highest heat-generating processor (up to the maximum flow rate cap, if needed). When there are blocks that are utilizing less liquid flow to maintain the desired cooling level for the components of that block, the rack-level controller can reduce the maximum flow rate cap for that block. In response to another block requiring greater liquid flow to maintain the desired cooling level for that block and assuming there are additional amounts of intake flow not being consumed by (and/or allocated maximum flow rate caps assigned to) all of the blocks, the rack-level controller increases the maximum flow rate cap for that block requiring the greater maximum flow rate. The block-level controller can then adjust the flow rate for that block accordingly.

Also disclosed is a DL RIHS that includes a rack having a plurality of LC nodes and a liquid cooling subsystem associated with the rack. The liquid cooling subsystem includes a first flow rate meter for measuring an incoming amount of cooling liquid supply being supplied to the DL RIHS. The liquid cooling system also includes a rack-level liquid flow infrastructure controller (LIC) that is communicatively coupled to liquid flow controllers of the LC nodes and to the first flow rate meter. The infrastructure controller receives an incoming cooling liquid supply flow rate corresponding to an amount of incoming cooling liquid being supplied to the LC RIHS and calculates a maximum flow rate cap for each of the LC nodes. The infrastructure controller transmits the maximum flow rate cap to the liquid flow controllers for the LC nodes, and the LIC triggers the liquid flow controllers for the LC nodes to adjust the maximum flow rate associated with a respective block of LC nodes to correspond to the received maximum flow rate cap for that respective block.

According to one embodiment, a liquid cooling subsystem includes a first flow rate meter for measuring an amount of incoming cooling liquid supply being supplied to the LC RIHS. The liquid cooling subsystem also includes a LIC. The LIC is communicatively coupled to one or more block controllers of respective LC nodes and to the first flow rate meter. The LIC has firmware executing thereon that configures the LIC to perform or trigger the completion of various liquid flow control functions at the rack level. The LIC receives an incoming cooling liquid supply flow rate from the first flow rate meter corresponding to an amount of incoming cooling liquid supply being supplied to the LC RIHS. The LIC calculates a maximum flow rate cap for each block of LC nodes. The LIC further transmits the maximum flow rate cap to block controllers each controlling liquid flow through one or more LC nodes within a corresponding block. The block controllers adjust the respective flow rates through respective blocks of LC nodes to correspond to the received maximum flow rate cap and based on the cooling needs of the particular block.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
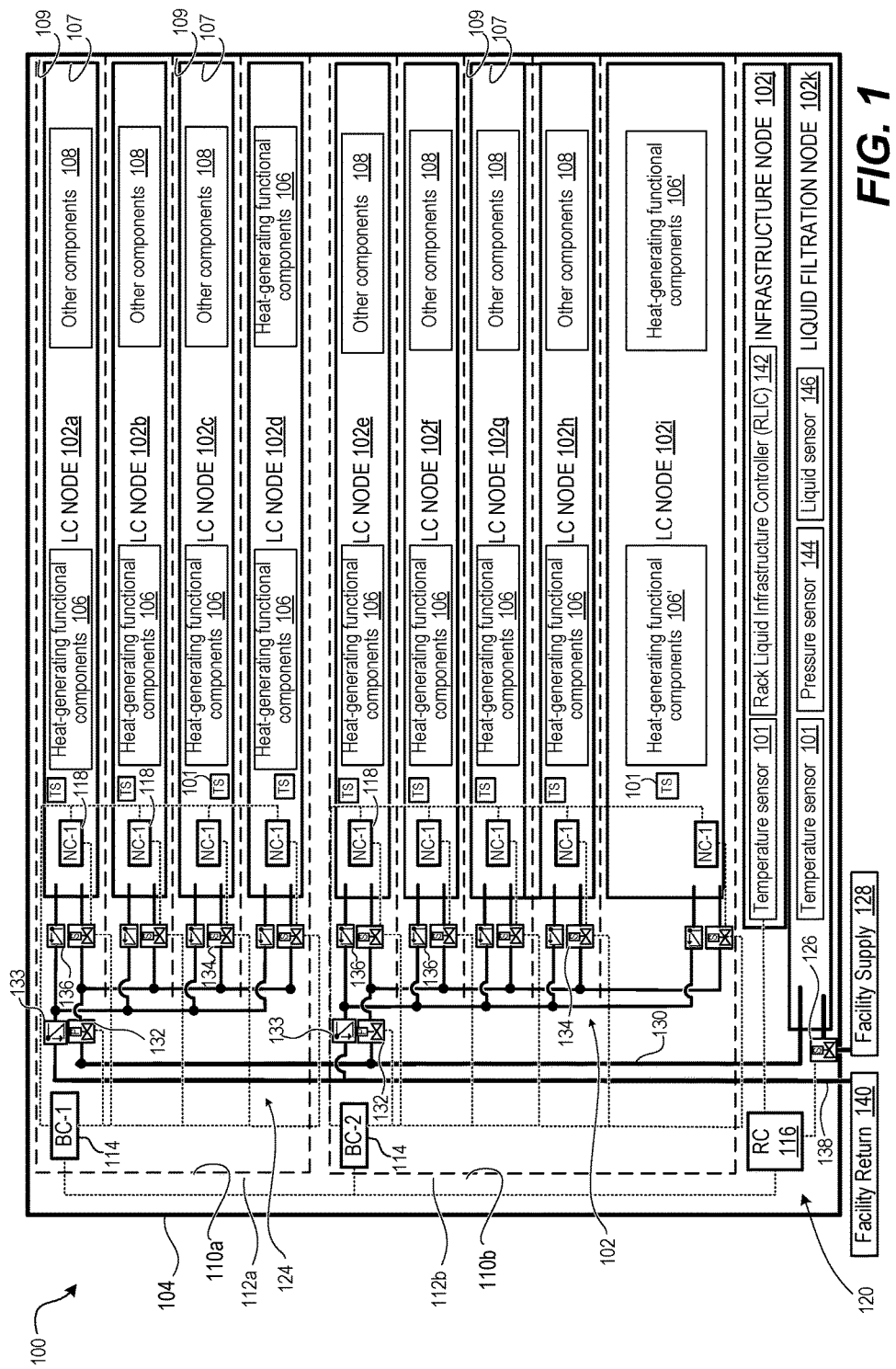
FIG. 1 illustrates a side perspective view of an internal layout/configuration of an example Direct-Interface Liquid-Cooled (DL) RIHS, according to one or more embodiments.

The present disclosure generally provides a Direct-Injection Liquid-Cooled (DL) Rack Information Handling System (RIHS) providing liquid cooled (LC) information technology (IT) nodes containing heat-generating functional components and which are cooled at least in part by a liquid cooling subsystem. The RIHS includes a rack configured with chassis-receiving bays in which is received a respective chassis of one of the LC nodes. Each LC node is configured with a system of conduits to receive direct injection of cooling liquid to regulate the ambient temperature of the node. Additionally, each LC node, configured with a system of conduits, provides cooling to the components inside the node by conductively absorbing, via the cooling liquid, heat generated by the heat-generating functional components. The absorbed heat is removed (or transferred away) from within the node to outside of the node and/or the RIHS.

The present disclosure also provides a computer-implemented method for controlling liquid cooling of liquid-cooled (LC) nodes in a DL RIHS. The method includes receiving, at a rack-level liquid flow infrastructure controller (LIC) of a liquid cooling control subsystem, an incoming cooling liquid supply flow rate corresponding to an incoming amount of cooling liquid being supplied to the DL RIHS. A maximum flow rate cap is calculated for each block of LC nodes. The maximum flow rate cap is transmitted to a controller for each block of the LC nodes. The controller adjusts the associated flow rate of cooling liquid for that block of LC nodes to correspond to the received maximum flow rate cap for that block.

According to one aspect, the LIC or block-level controller receives an input that identifies a highest temperature generated by the processors of LC nodes within each block and moderates the actual flow rate of the respective block to allow for adequate cooling of the highest heat-generating processor. When there are blocks that require less liquid flow to maintain the desired cooling level for the components of that block, the rack-level controller reduces the maximum flow rate cap for that block. In response to another block requiring greater liquid flow to maintain the desired cooling level for that block and there is additional amounts of intake flow not being consumed by all of the blocks, the rack-level controller increases the maximum flow rate cap for that block requiring the greater maximum flow rate.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As utilized herein, the term "rack-configured" (as in RIHS) generally refers to the configuration of a large scale sever system within a physical rack having multiple chassis receiving rails for receiving specific sizes of information technology (IT) nodes, such as server modules, storage modules, and power modules. The term node generally refers to each separate unit inserted into a 1U or other height rack space within the rack. In one embodiment, operational characteristics of the various IT nodes can be collectively controlled by a single rack-level controller. However, in the illustrated embodiments, multiple nodes can be arranged into blocks, with each block having a separate block-level controller that is communicatively connected to the rack-level controller.

For purposes of this disclosure, an information handling system (defined at the individual server level) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

As illustrated by the figures and described herein, multiple processing servers or server IHSs (referred to herein as server nodes) can be included within the single RIHS. Certain aspect of the disclosure then relate to the specific LC (sever or other) nodes and the functionality associated with these individual nodes or block-level groupings of nodes, while other aspects more generally relate to the overall DL RIHS containing all of the LC nodes.

As one design detail/aspect for the present innovation, consideration is given to the fact that extreme variations can exist in server/power/network topology configurations within an IT rack. In addition to dimension variations, the thermal requirements for heat-generating functional components for power, control, storage and server nodes can be very different between types or vary according to usage. These variations drive corresponding extreme diversity in port placement, fitting size requirements, mounting locations, and manifold capacity for a liquid cooling subsystem. Further, a chassis of each node is typically densely provisioned. Lack of space thus exists to mount a discrete water distribution manifold in high-power IT racks. The present disclosure addresses and overcomes the challenges with distributing liquid cooling fluids throughout an IT rack having nodes with a large number of variations in distribution components.

The disclosure also includes the additional consideration that in addition to cooling the primary heat generating components of the rack, such as the processor, what is needed is a way to allow for cooling of secondary equipment within the rack, as well as auxiliary components that would further support utilizing the advantages of a fluid-to-fluid heat exchanger methodology. Additionally, the present disclosure provides a modular approach to utilizing an air-to-liquid heat exchanger with quick connection and scalability to allow the solution to be scalable in both 1 U and 2 U increments.

FIG. 1 illustrates a side perspective view of an internal layout/configuration of an example Direct-Interface Liquid-Cooled (DL) RIHS 100 configured with a plurality of LC nodes 102, according to one or more embodiments. For simplicity, the example DL RIHS presented in the various illustrations can be described herein as simply RIHS 100; however, references to RIHS 100 are understood to refer to a DL RIHS, with the associated liquid cooling infrastructure and/or subsystems and supported LC nodes 102. RIHS 100 includes rack 104, which comprises a rack frame and side panels, creating a front-to-back cabinet within which a plurality of chassis receiving bays are vertically arranged and in which a chassis of a respective IT node 102 can be inserted. Rack 104 includes certain physical support structures (not specifically shown) that support IT gear insertion at each node location. Additional description of the structural make-up of an example rack is provided in the description of FIGS. 2-4, which follows.

FIG. 1 further depicts an illustrative example of LC nodes 102a-102j (collectively refer to as nodes 102), with each nodes 102a-102i including heat-generating functional components 106. Additionally, RIHS 100 also includes an infrastructure node 102j and liquid filtration node 102k, which do not necessarily include heat-generating functional components 106 that require liquid cooling, as the other LC nodes 102a-102i. In the illustrative embodiments, nodes 102a-102b, and 102e-102h include other components 108 that are not necessarily heat generating, but which are exposed to the same ambient heat conditions as the heat generating components by virtue of their location within the node. In one embodiment, these other components 108 can be sufficiently cooled by the direct injection of cooling liquid applied to the node and/or using forced or convective air movement, as described later herein. Each node 102 is supported and protected by a respective node enclosure 107. Nodes 102a-102d are further received in node receiving bays 109 of a first block chassis 110a of a first block 112a. Nodes 102e-102i are received in a second block chassis 110 of a second block 112b. In the illustrative embodiments, the nodes 102 are vertically arranged. In one or more alternate embodiments, at least portions of the nodes 102 (and potentially all of the nodes) may also be arranged horizontally while benefiting from aspects of the present innovation.

The present innovation is not limited to any specific number or configuration of nodes 102 or blocks 112 in a rack 104. According to one aspect, nodes 102 can be of different physical heights of form factors (e.g., 1 U, 1.5 U, 2 U), and the described features can also be applied to nodes 102 having different widths and depths (into the rack), with some extensions made and/or lateral modifications to the placement of cooling subsystem conduits, as needed to accommodate the different physical dimensions. As a specific example, node 102i is depicted as having a larger node enclosure 107' (with corresponding different dimensions of heat-generating functional components 106') of a different number of rack units in physical height (e.g., 2 U) that differs from the heights (e.g., 1 U) of the other nodes 102a-102h and 102j-102k. RIHS 100 can include blocks 112 or nodes 102 selectably of a range of discrete rack units. Also, different types of IT components can be provided within each node 102, with each node possibly performing different functions within RIHS 100. Thus, for example, a given node 102 may include one of a server module, a power module, a control module, or a storage module. In a simplest configuration, the nodes 102 can be individual nodes operating independent of each other, with the RIHS 100 including at least one rack-level controller (RC) 116 for controlling operational conditions within the RIHS 100, such as temperature, power consumption, communication, and the like. Each node 102 is then equipped with a node-level controller (NC) 118 that communicates with the rack-level controller 116 to provide localized control of the operational conditions of the node 102. In the more standard configuration of a DL RIHS 100, and in line with the described embodiments, RIHS 100 also includes block-level controllers (BCs) 114, communicatively coupled to the rack-level controller 116 and performing block-level control functions for the LC nodes within the specific block. In this configuration, the nodes 102 are arranged into blocks 112, with each block 112 having one or more nodes 102 and a corresponding block-level controller 114. Note the blocks do not necessarily include the same number of nodes, and a block can include a single node, in some implementations.

A Direct-Interface Liquid Cooling (DL) subsystem (generally shown as being within the RIHS and labelled herein as 120) provides liquid cooling to heat-generating functional components 106 via a liquid rail 124 under the control of the rack-level controller 116, block-level controllers 114, and/or node-level controllers 118, in some embodiments. Rack-level controller 116 controls a supply valve 126, such as a solenoid valve, to allow cooling liquid, such as water, to be received from a facility supply 128. The cooling liquid is received from facility supply 128 and is passed through liquid filtration node 102l before being passed through supply conduit 130 of liquid rail 124. Each block 112a, 112b receives a dynamically controlled amount of the cooling liquid via block-level dynamic control valve 132, such as a proportional valve. Return flow from each block 112a, 112b can be protected from backflow by a block check valve 133. The individual needs of the respective nodes 102a-102d of block 112a can be dynamically provided by respective node-level dynamic control valves 134, controlled by the block-level controller 114, which control can, in some embodiments, be facilitated by the node-level controllers 118. In addition to allocating cooling liquid in accordance with cooling requirements (which can be optimized for considerations such as performance and economy), each of the supply valve 126 and/or dynamic control valves 132, 134 can be individually closed to mitigate a leak. A check valve 136 is provided between each node 102*a*-102*j* and a return conduit 138 of the liquid rail 124 to prevent a backflow into the nodes 102*a*-102*j*. The return conduit 138 returns the cooling liquid to a facility return 140.

To support the temperature control aspects of the overall system, RIHS 100 includes temperature sensors 101 that are each located within or proximate to each node 102*a*-102*j*, with each gauge 101 connected to the node-level controller 118 and/or the corresponding block-level controller 114. Temperature sensors 101 operate in a feedback control loop of the liquid cooling system 122 to control the amount of liquid flow required to cool the nodes 102*a*-102*j*. In one or more embodiments, the rack-level controller 116 can coordinate performance constraints to block-level controllers 114 and/or node-level controllers 118 that limit an amount of heat generated by the heat-generating functional components 106 to match a heat capacity of the flow of cooling liquid in DL subsystem 122. Alternatively or in addition, the rack-level controller 116 can coordinate cooling levels to block-level controllers 114 and/or node-level controllers 118 that in turn control the dynamic control valves 132, 134 for absorption and transfer of the heat generated by the heat-generating functional components 106 by the DL subsystem 122. In one or more embodiments, support controllers such as a Rack Liquid Infrastructure Controller (RLIC) 142 can perform management and operational testing of DL subsystem 122. RLIC 142 can monitor pressure sensors 144 and liquid sensors 146 to detect a leak, to validate operation of named control valves 132, 134 or shut-off valves such as supply valve 126. RLIC 142 can perform close-loop control of specific flow rates within the RIHS 100.

Figure 2:
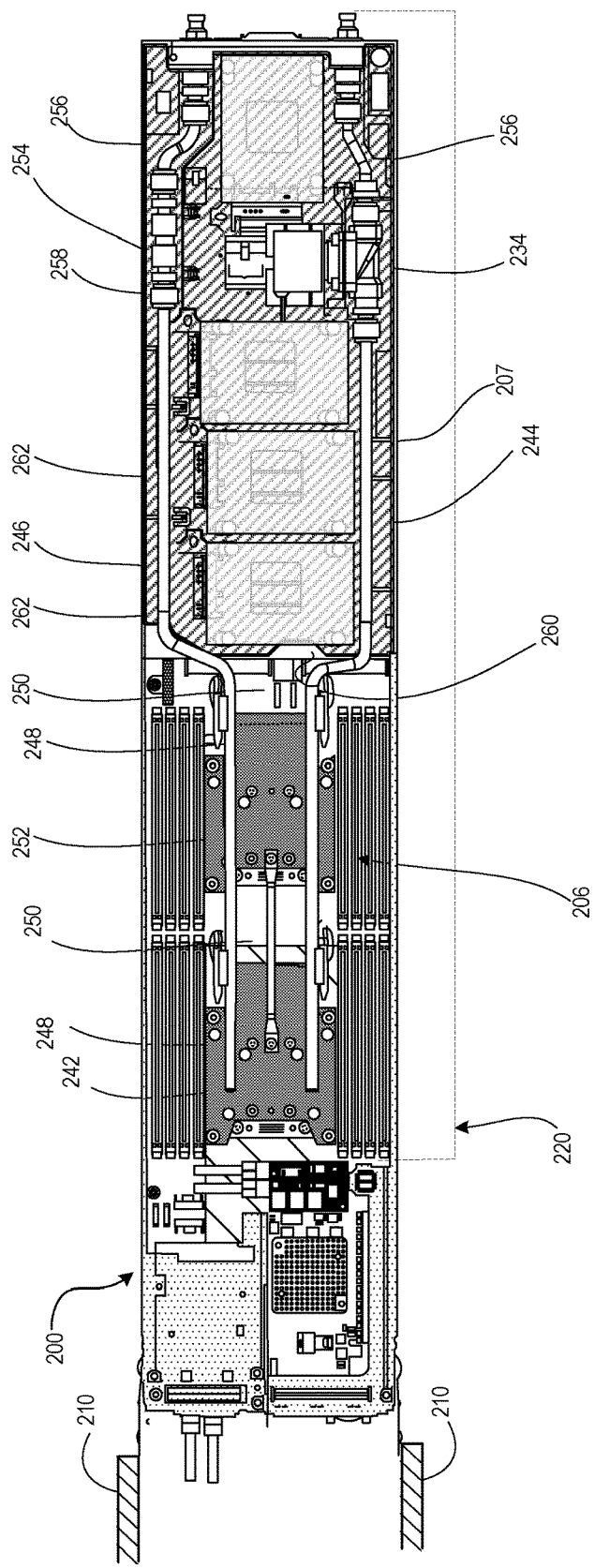
FIG. 2 illustrates a top view of an example LC node configured with a liquid cooling subsystem that includes a liquid-to-liquid manifold and cooling pipes for conductively cooling internal functional components, according to one or more embodiments.

FIG. 2 illustrates example LC node 200 of example DL RIHS 100 of FIG. 1 having a node enclosure 208 insertable into a block chassis 210. For purposes of description, node 200 is a server IHS that includes processing components or central processing units (CPUs), storage devices, and other components. LC node 200 includes cooling subsystem (generally shown and represented as 220) that includes a liquid-to-liquid manifold 242 to cool heat-generating functional components 206 by heat transfer from liquid provided by node-level supply conduit 244, and return conduit 246, according to one or more embodiments. Node-level supply conduit 244 and return conduit 246 are appropriately sized and architecturally placed relative to the other components and the dimensionality (i.e., width, height, and depth/length) of LC node 200 to permit sufficient cooling liquid to pass through the interior of LC the node 200 to remove the required amount of heat from LC node 200 in order to provide appropriate operating conditions (in terms of temperature) for the functional components located within LC node 200. Liquid-to-liquid manifold 242 can include CPU cold plates 248 and voltage regulator cold plates 250. A sled assembly grab handle 252 can be attached between CPU cold plates 248 for lifting LC node 200 out of block chassis 210. A return-side check valve 254 of the return conduit 246 can prevent facility water from back-feeding into LC node 200 such as during a leak event. Flex hose links 256 in each of node-level supply conduit 244 and return conduits 246 can reduce insertion force for sleds into block chassis 210. Sled emergency shutoff device 234 interposed in the supply conduit 244 can be a solenoid valve that closes in response to input from a hardware circuit during a sled-level leak detection event. Node-level carrier 258 received in node enclosure 208 can incorporate liquid containment structure 260 to protect storage device 262. In the illustrative example illustrated by FIG. 2, LC node 200 is oriented horizontally and is viewed from above. In one or more embodiments node-level carrier 258 is configured to route leaked cooling liquid away from storage device 262 when oriented vertically.

FIGS. 3-7 illustrate different exterior and rear views of an example assembled DL RIHS 300. DL RIHS 300 includes rack 304, which is a physical support structure having an exterior frame and attached side panels to create cabinet enclosure 364 providing interior chassis receiving bays (not shown) within which a plurality of individual node chasses (or sleds) 208 of functional IT nodes, such as LC node 200 of FIG. 2, are received. In the description of the figures, similar features introduced in an earlier figure are not necessarily described again in the description of the later figures.

Figure 4:
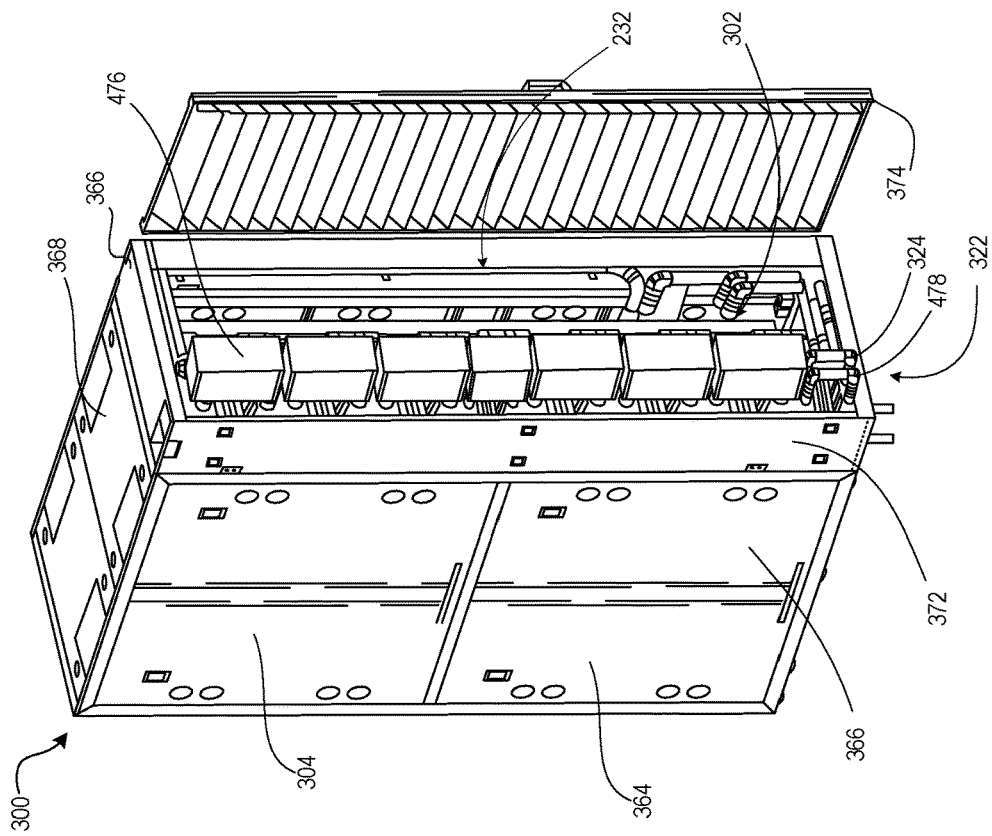
FIGS. 4 and 5 illustrate a rear perspective view of the example DL RIHS of FIG. 3 with the louvered rear door opened to expose node-to-node interconnection of MLD conduits of different vertical sizes having appropriately sized and removable pipe covers, according to one or more embodiments.
Figure 3:
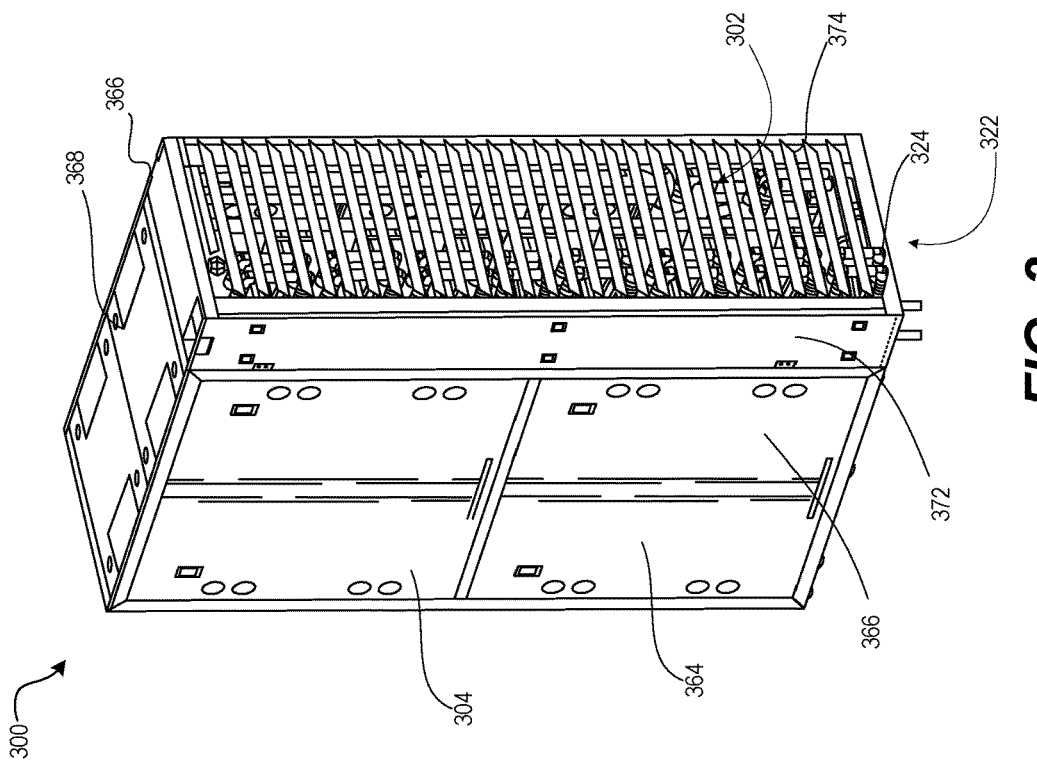
FIG. 3 illustrates a rear perspective view of an example DL RIHS with a louvered rear door in a closed position over uncovered MLD conduits, according to one or more embodiments.
Figure 5:
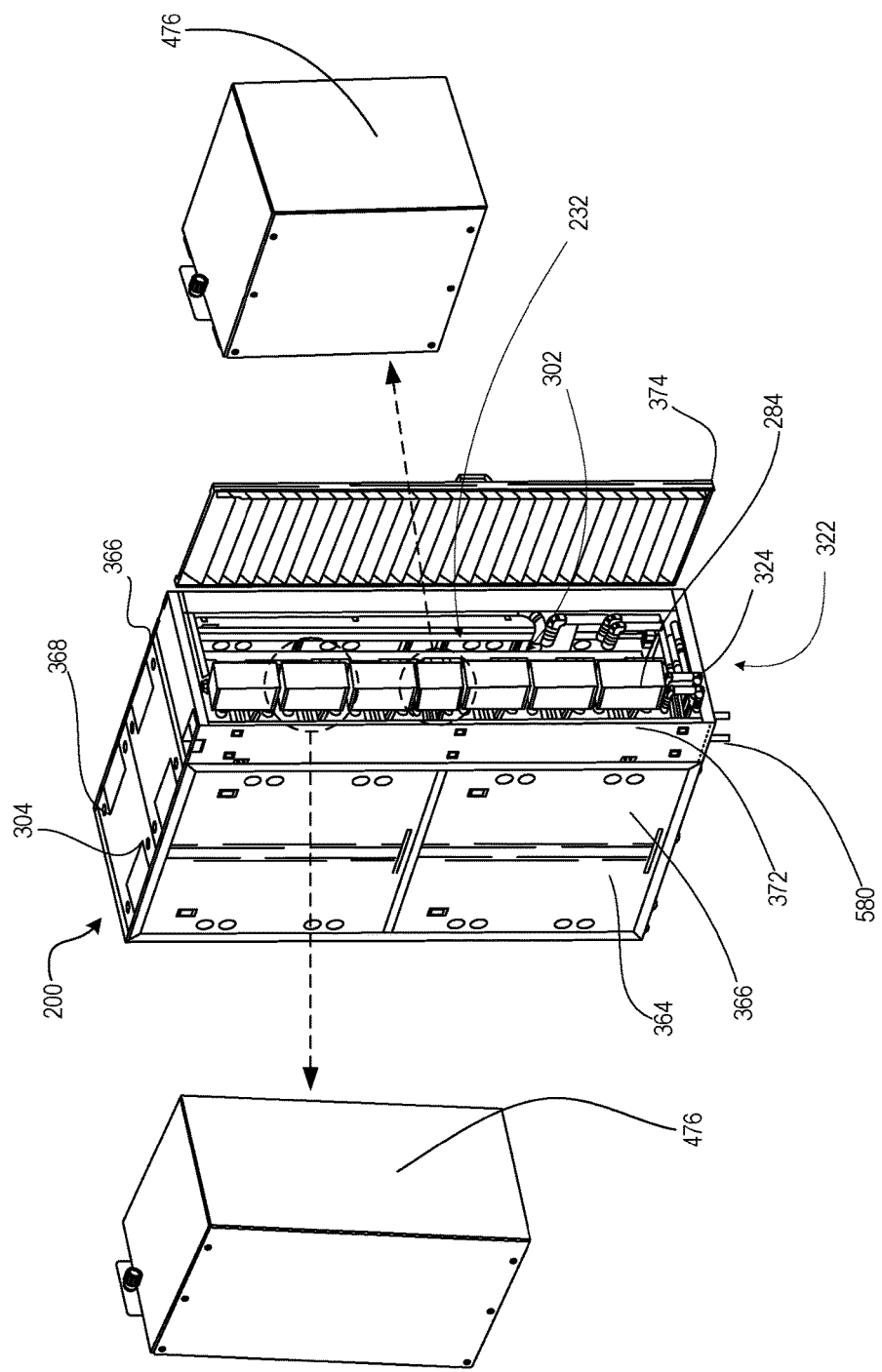

FIGS. 3-5 specifically illustrate exterior views of rack 304 of example DL RIHS 100. As illustrated, rack 304 includes opposing side panels 366, attached to a top panel 368 (and bottom panel—not shown) to create the main cabinet enclosure 364 that includes multiple chassis receiving bays for housing LC nodes 102/200. The created cabinet enclosure 364 includes a front access side (not shown) and a rear side. The front access side provides access to the chassis receiving bays created within the main cabinet enclosure 364 for receiving LC nodes 102 (of FIG. 1) into rack 304. Attached to the rear ends of the main opposing side panels 366 are opposing side panel extensions 372. A louvered rear door 374 is hinged (or otherwise attached) to one of the side panel extensions 372 and includes a latching mechanism for holding the door 374 in a closed position, where in a closed position is relative to the otherwise open space extending laterally between opposing side panel extensions 372. Side panel extensions 372 and louvered rear door 374 provide an extension to main cabinet enclosure 364 for housing, covering/protecting, and providing access to the modular, scalable liquid rail 324 of a liquid cooling subsystem 322 that provides liquid cooling to each LC node 102 (of FIG. 1) inserted into the chassis of the main cabinet enclosure 364.

FIG. 4 illustrates an embodiment in which rear pipe covers 476 can protect portions of liquid rail 324 (of FIG. 3), and specifically Modular Liquid Distribution (MLD) conduits 478, from inadvertent damage as well as containing any leaks from being directed at sensitive functional components 106 (of FIG. 1).

Illustrated in FIG. 5 are rear pipe covers 476 (of FIG. 4) of MLD conduits 478 (of FIG. 4) of liquid rail 324 (of FIG. 3) having different sizes. According to one aspect, the MLD conduits 478 (of FIG. 4) are rack unit dimensioned pipes that form a node-to-node scalable rack liquid manifold ("liquid rail") to distribute cooling liquid, as required, for each node 102 (of FIG. 1) and through the vertical arrangement of nodes 102 (of FIG. 1) within RIHS 100 (of FIG. 1). In an exemplary embodiment, the cooling liquid is received from a facility supply 128 (of FIG. 1) via below rack (e.g. ground level or below floor) connections 580.

Figure 6:
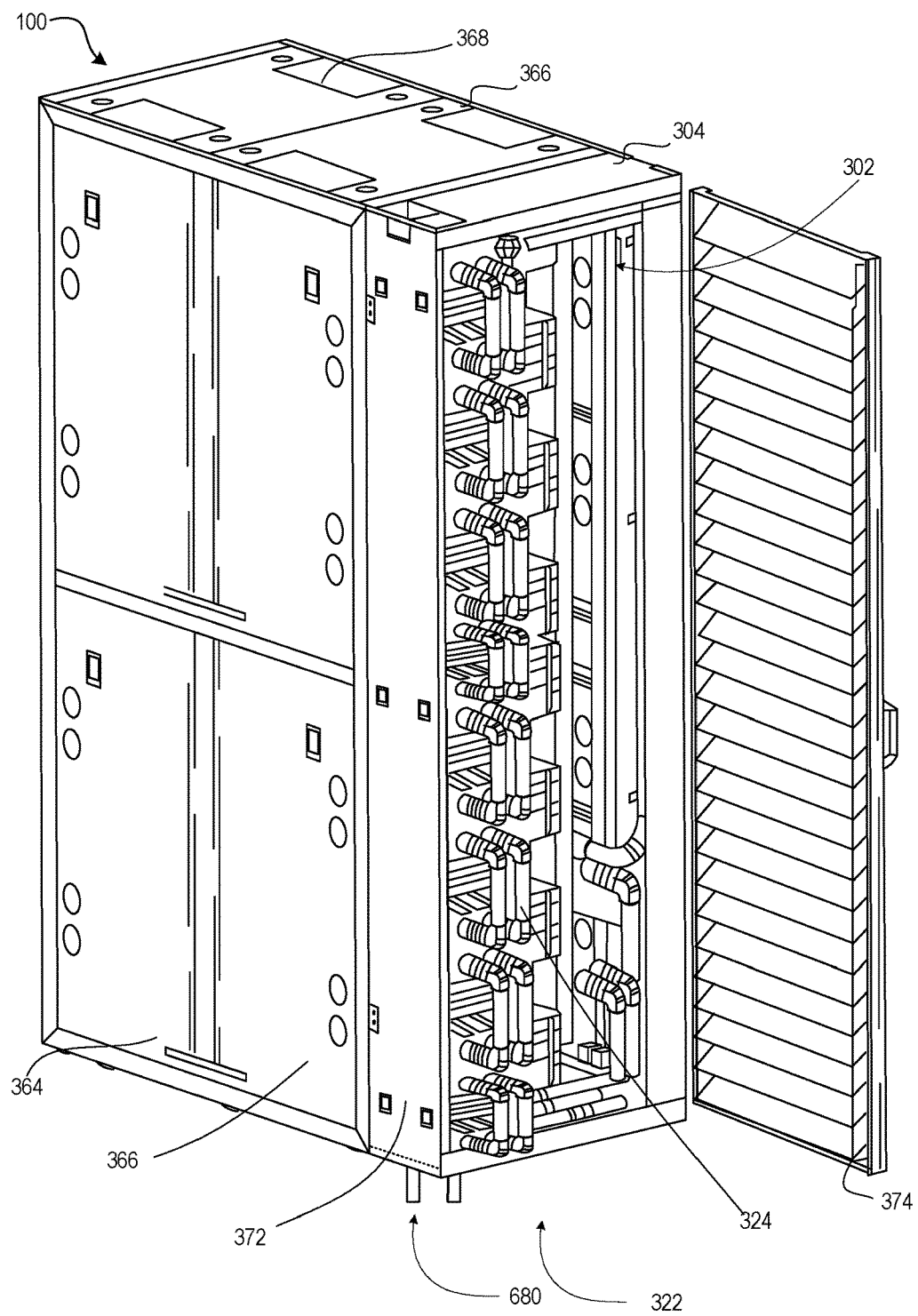
FIG. 6 illustrates the rear perspective view of FIGS. 4-5 with the pipe covers removed to expose the MLD conduits, according to one or more embodiments.

FIG. 6 illustrates an example RIHS 100, as depicted in FIG. 1, with MLD conduits 478 (of FIG. 4), that are uncovered, displaying liquid rail 324 (of FIG. 3). In the embodiment of FIG. 6, cooling liquid is received from a facility supply 128 (FIG. 1) by below rack (e.g. ground level or below floor) connections 680.

Figure 7:
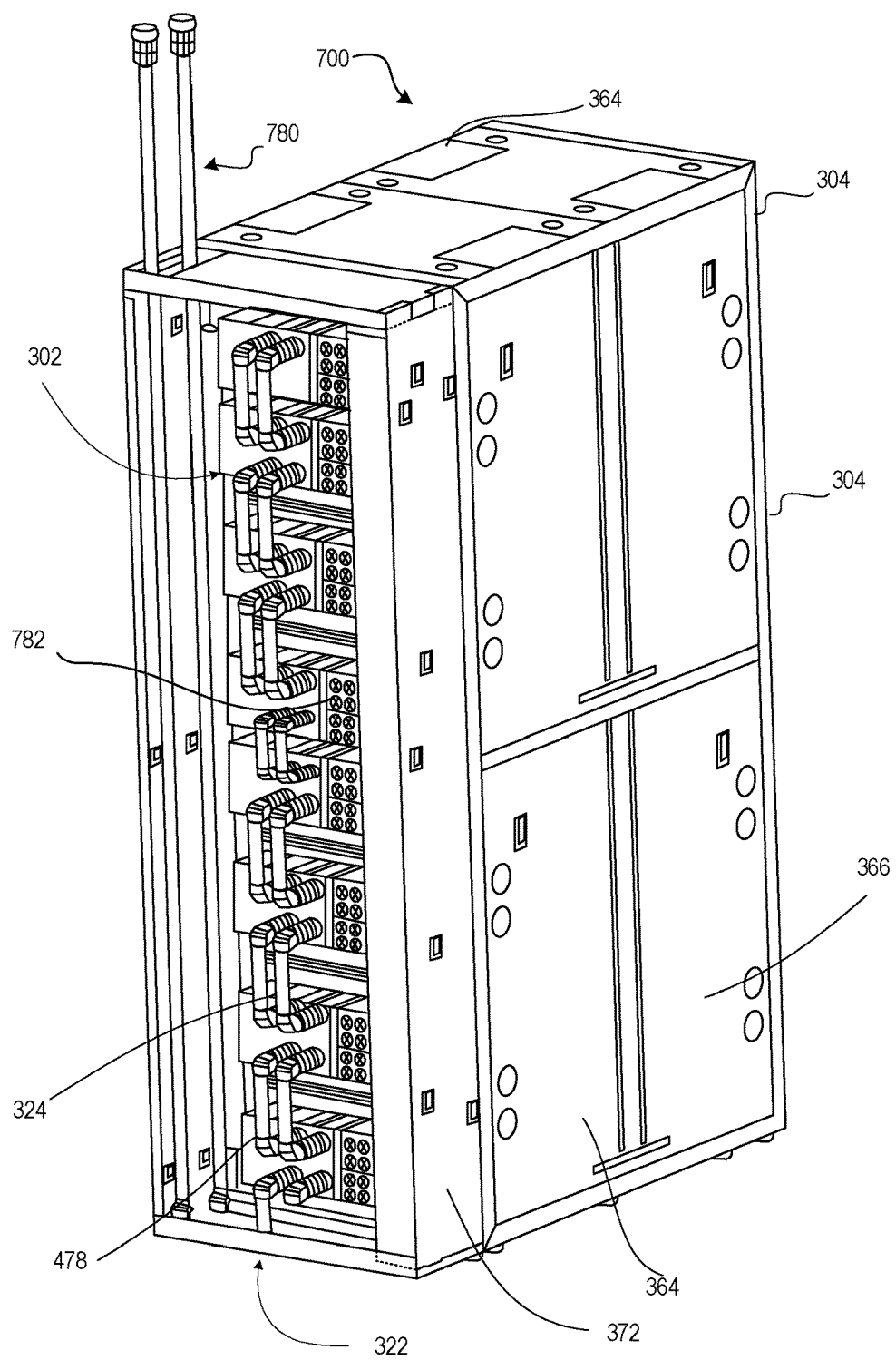
FIG. 7 illustrates a rear perspective view of an example RIHS with MLD conduits in fluid communication with supply side conduits extending from a top of the rack, according to one or more embodiments.

FIG. 7 illustrates a second example RIHS 700, wherein cooling liquid is received from facility supply 128 (FIG. 1) provided by an above-rack (and possibly in ceiling) connections 780. Also shown by FIG. 7 are air movers depicted as fan modules 782 adjacent to the liquid rail. These fan modules 782 are mounted at the back of RIHS 700 to draw air flow through LC nodes 102 providing additional cooling of LC nodes 102, of FIG. 1, (e.g., convection cooling for node components 106, of FIG. 1) that may or may not also receive direct-interface of cooling liquid, in different embodiments.

Figure 8:
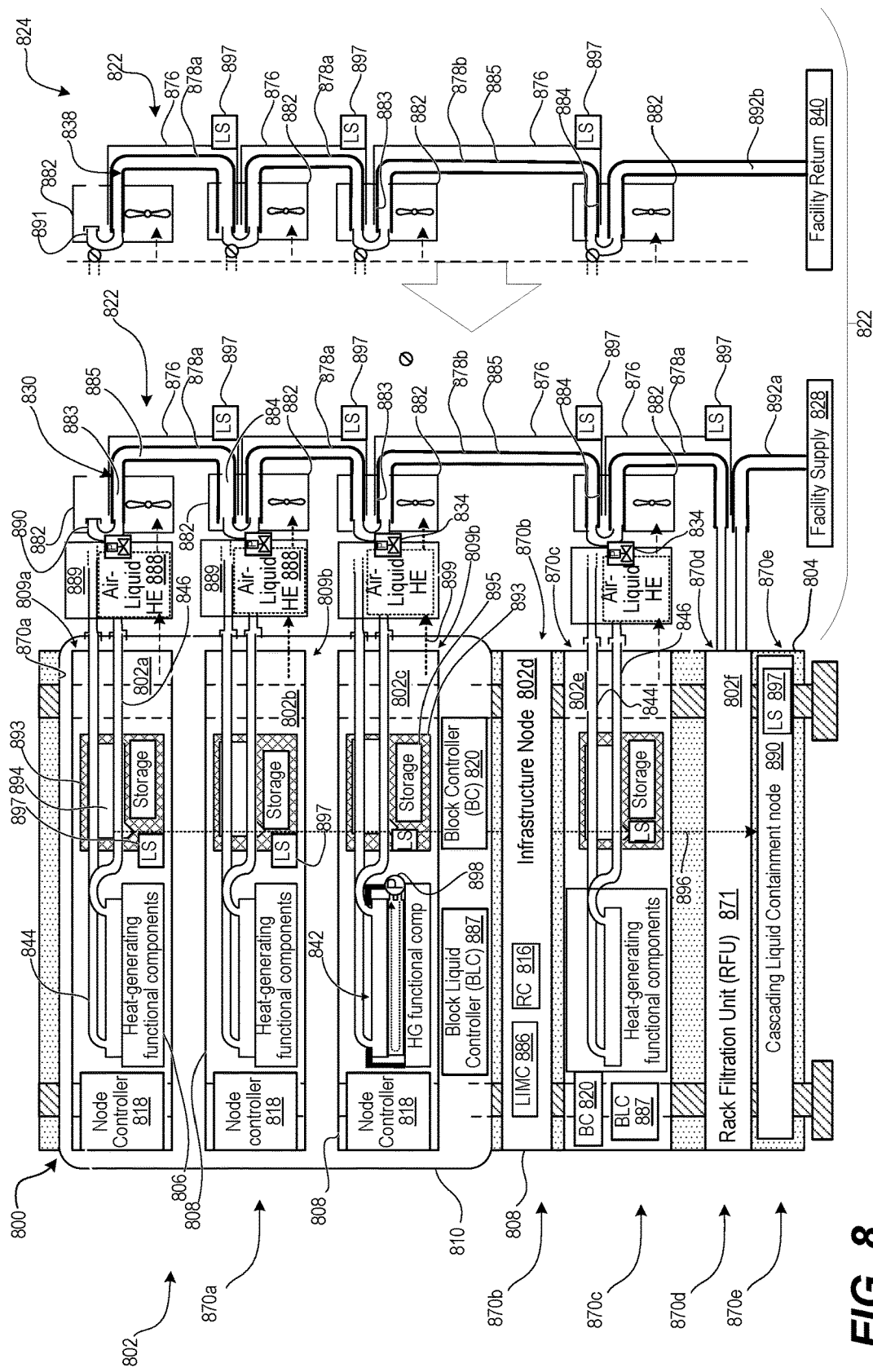
FIG. 8 illustrates a detailed block diagram of a DL RIHS configured with LC nodes arranged in blocks and which are cooled in part by a liquid cooling system having a rail comprised of MLD conduits, and in part by a subsystem of air-liquid heat exchangers, according to multiple embodiments.

FIG. 8 illustrates a more detailed view of the interconnections of the liquid cooling subsystem, at a node level and rack level within an example DL RIHS 800. As shown, RIHS 800 is configured with LC nodes 802a-802e arranged in blocks (e.g., block 1 comprising 802a-802c) and which are cooled in part by a liquid cooling system having a liquid rail comprised of MLD conduits, and in part by a subsystem of air-liquid heat exchangers, can be configured with heat-generating functional components 806 and that are cooled at least in part by a system of MLD conduits 878a-878b, according to one or more embodiments. Illustrated within nodes 802 are heat-generating functional components 806, such as processors, voltage regulators, etc., which emit heat during operation and or when power is applied to the component, such that the ambient temperature increases around the component, and within the node, and eventually within the block, and ultimately DL RIHS 800, during standard operation. To mitigate heat dissipation (and effects thereof), and to maintain the RIHS, block, node, and functional components within proper operating temperatures, DL RIHS 800 is configured with a DL subsystem 822. DL subsystem 822 includes a rack level network of liquid propagating pipes, or conduits that are in fluid communication with individual node level networks of liquid propagating conduits. Additionally, DL subsystem 822 collectively facilitates heat absorption and removal at the component level, the node level, the block level, and/or the rack level. The rack-level network of conduits includes a modular arrangement of a liquid rail 824 formed by more than one node-to-node MLD conduit 878 a-878b spanning (or extending) between LC nodes 802 provisioned in rack 804.

At the top position of RIHS 800, a block chassis 810 is received in a block chassis receiving bay 870a of rack 804. Within block chassis 810, a first node 802a received in a first node receiving bay 809a of the rack 804 has a vertical height of one rack unit (1 U). A rack unit, U or RU as a unit of measure, describes the height of electronic equipment designed to mount in a 19-inch rack or a 13-inch rack. The 19 inches (482.60 mm) or 13 inches (584.20 mm) dimension reflects the horizontal lateral width of the equipment mounting-frame in the rack including the frame; the width of the equipment that can be mounted inside the rack is less. According to current convention, one rack unit is 1.75 inches (44.45 mm) high. A second node 802b received in a second node receiving bay 809b of the rack 104 (of FIG. 1) has a vertical height of 1 U. A third node 802c received in a third node receiving bay 809c of the rack 804 has a vertical height of 1 U. A fourth node 802d, infrastructure node 802b, is received in a second block chassis receiving bay 870b of rack 804 and has a vertical height of 1 U. Infrastructure node 802b can contain functional components such as a rack-level controller 816. A fifth node 802e is received in a third chassis receiving bay 870c and has a vertical height of 2 U. A sixth node 802f, which provides a Rack Filtration Unit (RFU) 871, is received in a fourth block chassis receiving bay 870d of the rack 804. Infrastructure node 802 and RFU 871 are examples of nodes 802 that may not require liquid cooling. A cascading liquid containment unit 890 is received in a fifth chassis receiving bay 870e and includes liquid sensor 897.

MLD conduits 878a of 1U can be used to connect nodes of 1U vertical spacing. Because of the additional 1U separation of LC nodes 802c and 802e by inclusion of infrastructure node 802d, MLD conduit 878b between the third and fifth nodes 802c-802d is dimension 2U to accommodate the increased spacing. MLD conduits 878 a-878b can thus support different heights (1 U to NU) of IT components.

Each MLD conduit 878 a-878b includes first and second terminal connections 883, 884 attached on opposite ends of central conduit 885 that is rack-unit dimensioned to seal to a port of LC node 802 and enable fluid transfer between a port of a selected LC node 802 and a port of an adjacent LC node 802. In FIG. 8, facility supply 828 and facility return 840 are respectively located at the intake end of liquid rail 824 and the exhaust end of liquid rail 824. The actual location of facility supply 828 and facility return 840 can be reversed. Alternatively, facility supply 828 and facility return 840 can be located above the RIHS 800 or both conduits can be located on opposite sides of the RIHS 800 in alternate embodiments.

Liquid cooling subsystem 822 includes a liquid infrastructure manager controller (LIMC) 886 which is communicatively coupled to block liquid controllers (BLCs) 887 to collectively control the amount of cooling liquid that flows through the RIHS 800 and ultimately through each of the nodes 802 in order to effect a desired amount of liquid cooling at the component level, node level, block level, and rack level. For clarity, LIMC 886 and BLCs 887 are depicted as separate components. In one or more embodiments, the liquid control features of the LIMC 886 and BLCs 887 can be incorporated into one or more of the rack-level controller 816, block-level controllers 820, and the node-level controllers 818. As illustrated in FIG. 1 and previously described, each of the LIMC 886 and BLCs 887 are connected to and respectively control the opening and closing of flow control valves that determine the amount of flow rate applied to each block and to each node within the specific block. During cooling operations, one of LIMC 886 and BLC 887 causes a specific amount of liquid to be directly injected into the intake conduits of the LC node 802, which forces the cooling liquid through the system of conduits within the LC node 802 to the relevant areas and/or functional components/devices inside the nodes 802 to absorb and remove heat away from the inside of the node and/or from around the components within the node.

As another aspect, the present disclosure provides a modular approach to utilizing air-to-liquid heat exchanger 888 with quick connection and is scalable in both 1 U and 2 U increments. In one or more embodiments, DL cooling subsystem 822 can include a plurality of air-to-liquid (or liquid-to-air) heat exchangers 888 that facilitate the release of some of the heat absorbed by the exhaust liquid to the surrounding atmosphere around the RIHS 100 (of FIG. 1). Air-to-liquid heat exchangers 888 can be integral to block liquid manifold 889 that, along with the MLD conduits 878a-878b, form scalable liquid rail 824. One aspect of the present disclosure is directed to providing scalable rack-mounted air-to-liquid heat exchanger 888 for targeted heat rejection of rack-mounted equipment to DL cooling subsystem 822. Hot air 899 from auxiliary components, such as storage device 895, would be pushed through the air-to-liquid heat exchanger 888, and the resulting energy would transfer to liquid rail 824 and be rejected to a facility cooling loop, represented by the facility return 840.

RIHS 800 can include variations in LC node 802 that still maintain uniformity in interconnections along liquid rail 824 formed by a chassis-to-chassis modular interconnect system of MLD conduits 878a-878b. With this scalability feature accomplished using MLD conduits 878a-878b, cooling subsystem 822 of the RIHS 800 allows each block chassis 810 to be a section of a scalable manifold, referred herein as liquid rail 824, eliminating the need for a rack manifold. The scalability of liquid rail 824 enables flexible configurations to include various permutations of server and switch gear within the same rack (rack 804). MLD conduits 878a-878b can comprise standardized hoses with sealable (water tight) end connectors. Thus, the rack liquid flow network can encompass 1 to N IT chassis without impacting rack topology, space constraints, and without requiring unique rack manifolds. Additionally, according to one aspect, the MLD conduits are arranged in a pseudo daisy chain modular configuration, which allows for unplugging of one MLD conduit from one rack level without affecting liquid flow to and cooling of other rack levels.

The system of conduits extending from node intake valve 834 into each LC node 802 enables each LC node 802 to engage to block liquid manifold 889. Block chassis 810 or node enclosure 808 of each LC node 102 provides the intake and exhaust conduit connections to engage to respective terminals of MLD conduits 878 a-878b within the MLD network provided by liquid rail 824. For example, where nodes 802 are designed as sleds, node enclosure 808 would be a sled tray, and each block would then include more than one sled tray received into block chassis 810, forming the extensions of block liquid manifold 889. Alternatively, the node enclosure 808 can be a single node chassis such as one of nodes 802c-802f.

Figure 9:
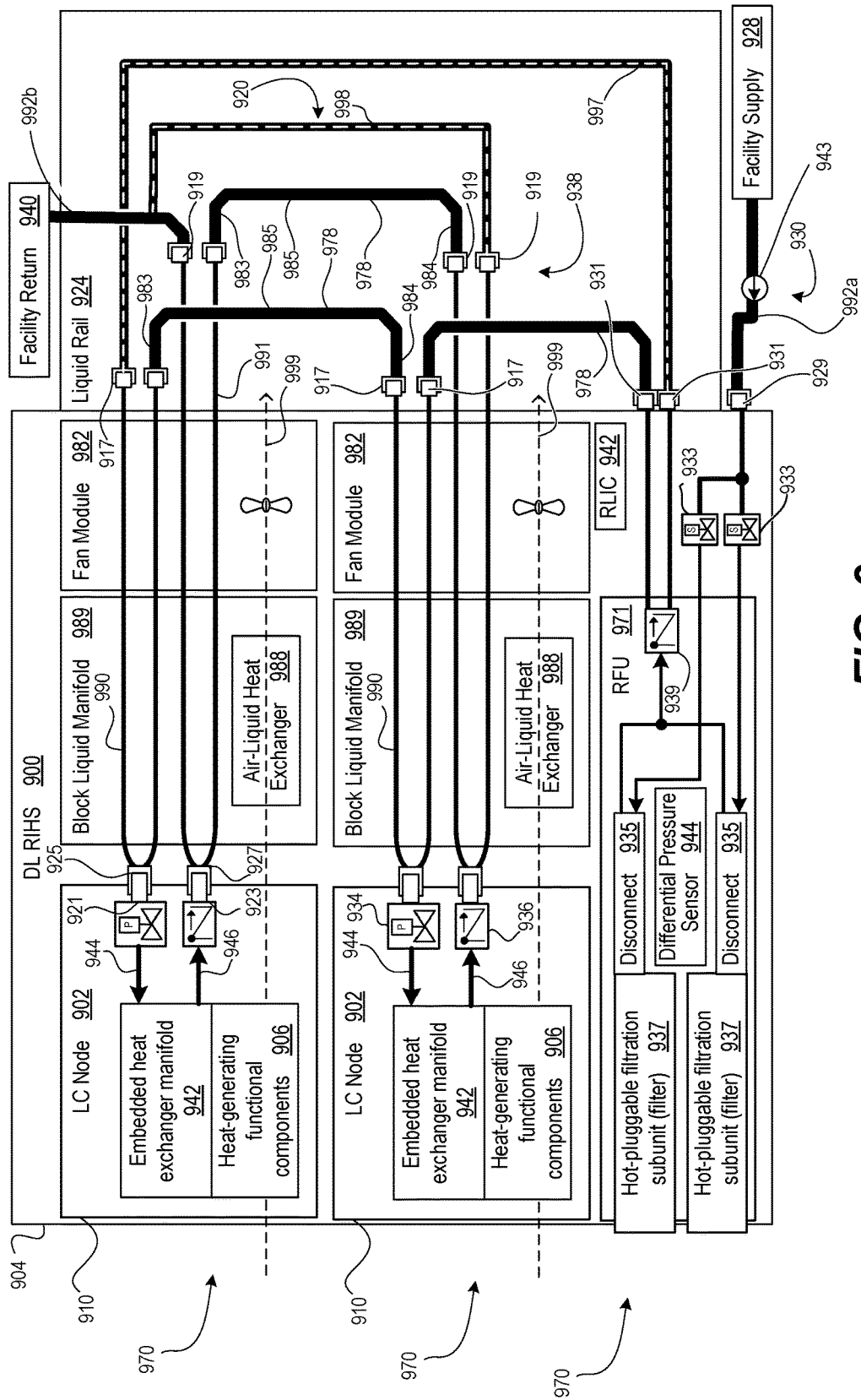
FIG. 9 illustrates an expanded, more detailed view of the liquid interconnection between the node level heat exchange manifold, the block liquid manifold containing the air-liquid heat exchanger, and example MLDs of the liquid rail, according to multiple embodiments.

Supply and return bypass tubes 890, 891 of each block liquid manifold 889 are connected by MLD conduits 878a-878b to form supply rail conduit 830 and return rail conduit 838. Due to constraints in the spacing within the figure, the tubing that extends from supply and return bypass tubes 890, 891 are not shown, and the valves are shown as if connected directly to the bypass. FIG. 9 provides a more accurate view of this feature of the disclosure, with conduits extended into the respective supply and return valves at each block. Also, for clarity, FIG. 8 illustrates the return rail conduit 838 separately. Liquid rail 824 enables multiple types of devices to be coupled together, each receiving an appropriately controlled portion of cooling liquid capacity. In one embodiment, liquid cooling subsystem 822 is passively pressurized by attaching MLD supply conduit 892a to facility supply 828 and an MLD return conduit 892b to facility return 840. Liquid flow from supply rail conduit 830 to return rail conduit 838 of liquid rail 824 can be controlled based upon factors such as a temperature of the liquid coolant, detected temperature within LC nodes 802, air temperature inside or outside of DL RIHS 800, etc.

In an exemplary embodiment, the scalable rack manifold provided by liquid rail 824 is formed in part by MLD conduits 878 a-878b that run vertically in the back of the RIHS 800 with quick disconnects on the front and rear face of block liquid manifold 889 that allows for IT/infrastructure equipment respectively to be plugged into both front and back sides of the block liquid manifold 889. For example, LC nodes 802, such as server modules, can plug into the front side and fan modules 882 can plug onto the back side of block liquid manifold 889. This also allows for other liquid cooled devices such as LC Power Distribution Units (PDUs) to be plugged into the cooling liquid supply rail conduit 830 and return rail conduit 838 of liquid rail 824. Thereby, a rack hot pluggable cooling interface is created for any rack-mounted equipment.

Cooling subsystem 822 can support an embedded liquid-to-liquid heat exchanger manifold 842, such as in LC node 802c. Node liquid-to-liquid heat exchangers are provided for rejecting heat from one fluid source to a secondary source.

One aspect of the present disclosure solves the problems that many shared-infrastructure IT systems (e.g., blade chassis) do not have adequate space to accommodate a liquid-to-liquid heat exchanger. Unlike with generally-known systems that rely upon liquid heat transfer having to exchange heat with an external liquid-to-liquid heat exchanger, the present disclosure enables on-rack liquid-to-liquid heat exchanger that does not require any of the vertical chassis space. Additionally, the present disclosure provides these benefits without requiring a central distribution unit (CDU), which takes up datacenter floor space. One aspect of the present disclosure provides embedded heat exchanger manifold 842 having a common heat transfer plate and a shared bulk header to create a combined liquid distribution manifold that includes a secondary liquid coolant for absorbing heat through the shared bulk header. In particular, the combined embedded heat exchanger manifold 842 rejects heat within shared node enclosure 808 such as node 802c to a secondary liquid coolant. Internal node supply 844 and return conduits 846 of a manifold built on top of a heat exchanger core allow heat transport within manifold 842. In one embodiment, closed system pump 898 can use a first coolant to cool a high thermal energy generating functional component such as a CPU or voltage regulator.

Additionally, the liquid cooling subsystem 822 also includes a filtration system or unit 871, which prevents chemical impurities and particulates from clogging or otherwise damaging the conduits as the fluid passes through the network of conduits. According to one aspect of the disclosure, liquid cooling subsystem 822 provides RFU 871 in fluid connection with the intake pipes from facility supply 828. In at least one embodiment, RFU 871 includes a sequenced arrangement of liquid filters within a full-sized sled that can be removably inserted by an end user into one of the receiving slots of rack 804. In one embodiment, the RFU 871 is located on an infrastructure sled having rack-level controllers and other rack-level functional components. In at least one embodiment, the entirety of the sled is filed with components associated with RFU 871. Thus, it is appreciated that the RFU 871 may occupy the entire area of one vertical slot/position within the chassis. Alternate locations of the RFU 871 can also be provided, in different embodiments, with an ideal location presenting the intake port of the RFU 871 in close proximity to a connection to facility supply 828 to directly receive the facility supply 828 prior to the liquid being passed into the remainder of the conduits of the liquid cooling subsystem 822. It is appreciated that if the system was capable of completing all heat exchange within the rack, then sealing the rack would be feasible and would reduce and/or remove any requirements for filtration and/or allocation of rack space for RFU 871.

Liquid cooled compute systems use the high heat transport capacity of water. However, the disclosure recognizes and addresses the fact that with liquid introduced into an electronic enclosure, there is a potential for leaks that can cause catastrophic system failure. Also, in some instances, a leak can create an electronic short with a resulting exothermal reaction causing permanent damage to the DL RIHS 800. To mitigate such risks, as one design feature, node-level carrier 893 can include a trench/gutter system for use as liquid containment structure 894. In one embodiment, the gutter system can also incorporate an absorbent material that can accumulate sufficient amounts of liquid from small leaks to enable external sensing of the leak. Advantageously, the carrier 893 can also be thermally conductive to serve as a heat sink for components such as storage devices 895. In one embodiment, another leak detection solution that can be incorporated into the LC node 802 involves use of a solenoid to create an event when additional current is applied, due to water pooling around the solenoid. Barriers on carrier 893 can be specifically designed to contain a liquid leak and assist in funneling the liquid through the gutter system. Liquid rail 824 can also be provided with leak containment and detection. In one or more embodiments, removable pipe covers 876 are sized to be mounted around respective MLD conduits 878a-878b and can include liquid sensors 897 for automatic alerts and shutdown measures.

In one or more embodiments, DL RIHS 800 further incorporates a node-level liquid containment structure 890 with a cascading drain runoff tubing network 896 to a rack-level cascading liquid containment structure 894. In one or more embodiments, the DL RIHS 800 further incorporates leak detection response such as partial or complete automated emergency shutdown. Liquid sensors (LS) 897 at various cascade levels can identify affected portions of DL RIHS 800. Containment and automatic shutoff can address the risks associated with a leak developing in the DL cooling system 822.

FIG. 9 illustrates a more detailed view of DL subsystem 920 associated with example DL RIHS 900. Within DL RIHS 900, each LC node 902 includes chassis 910 received in a respective chassis-receiving bay 970 of rack 904. Each LC node 902 contains heat-generating functional components 906. Each LC node 902 is configured with a system of internal supply conduit 944 and return conduit 946, associated with embedded heat exchanger manifold 942. Embedded heat exchanger manifold 942 receives direct injection of cooling liquid to regulate the ambient temperature of LC node 902. A node-level dynamic control valve 934 and node-level return check valve 936 control an amount of normal flow and provide shutoff and/or otherwise mitigate a leak. Cooling subsystem 920 provides cooling to heat-generating functional components 906 inside the LC node 902 by removing heat generated by heat-generating functional components 906. Liquid rail 924 is formed from more than one node-to-node, MLD conduit 978 between more than one LC node 902 within in rack 904. MLD conduits 978 includes first terminal connection 983 and second terminal connection 984. First terminal connection 983 and second terminal connection 984 are attached on opposite ends of central conduit 985. Central conduit 985 is rack-unit dimensioned to directly mate and seal to and enable fluid transfer between a selected pair of rail supply ports 917 and/or rail return ports 919 of a selected LC node 902 and an adjacent LC node 902.

The cooling subsystem 920 includes block liquid manifolds 989 mountable at a back side of the rack 904. Each block liquid manifold has at least one rail supply port 917 and at least one rail return port 919 on an outside facing side of the block liquid manifold 989. The at least one rail supply port 917 and the at least one rail return port 919 respectively communicate with at least one block supply port 921 and a block return port 923 on an inside facing side of the block liquid manifold 989. LC nodes 902 are insertable in receiving bays 970 of rack 904 corresponding to locations of the mounted block liquid manifolds 989. Block supply ports 921 and block return ports 923 of the LC nodes 902 and an inside facing portion of the corresponding block liquid manifold 989 are linearly aligned. The linear alignment enables direct sealing, for fluid transfer, of the lineally aligned inside manifold supply ports 925 and return ports 927 to the inside facing portion of the block liquid manifold 989. In one or more embodiments, block supply port 921 sealed to the internal manifold supply port 925 communicates via supply bypass tube 990 to two rail supply ports 917. Block return port 923 sealed to internal manifold return port 927 communicates via return bypass tube 991 of the respective block liquid manifold 989 to two rail return ports 919. Fan modules 982 mounted respectively onto back of block liquid manifold 989 have apertures to expose rail supply 917 and return ports 919. Additionally, fan modules 982 draw hot air 999 from LC nodes 902 through an air-liquid heat exchanger 988 in block liquid manifold 989.

In one or more embodiments, supply liquid conduit 992a is attached for fluid transfer between facility supply 928 and rail supply port 917 of block liquid manifold 989 of RIHS 900. A return liquid conduit 992b can be attached for fluid transfer between rail return port 919 of block liquid manifold 989 to facility return 940. FIG. 9 further illustrates that the fluid connection to facility supply 928 includes RFU 971. To prevent contamination or causing damage to cooling subsystem 920, RFU 971 is received in bay 970 of rack 904 and includes one of two input ports 929 connected via supply liquid conduit 992a to facility supply 928. The RFU 971 includes one of two output ports 931 that is connected to MLD conduit 978 of supply rail conduit 930. Liquid rail 924 also includes return rail conduit 938. RFU 971 controls two parallel emergency shutoff valves 933 for controlling the liquid flow received from input port 929 and which is provided via hot-pluggable disconnects 935 to two replaceable filtration subunits ("filters") 937. The flow of cooling liquid from supply input port 929 flows in parallel to two replaceable filtration subunits 937, automatically diverting to the other when one is removed for replacing. Thereby, filtration and cooling of RIHS 900 can be continuous, even when one filter is removed and/or one of the valves malfunctions (e.g., does not open). Back-flow is prevented by check valve 939 that allows normal flow to exit to output port 931. Differential pressure sensor 944 measures the pressure drop across filters") 937 and provides an electrical signal proportional to the differential pressure. According to one aspect, a Rack Liquid Infrastructure Controller (RLIC) 942 can determine that one filter 937 is clogged if the differential pressure received from differential pressure sensor 944 falls below a pre-determined value.

In one or more embodiments, RIHS 900 can provide hot-pluggable server-level liquid cooling, an integrated leak collection and detection trough, and an automatic emergency shut-off circuit. At a block level, RIHS 900 can provide embedded air-to-liquid heat exchange, and dynamic liquid flow control. At a rack level, RIHS 900 can provide facility-direct coolant delivery, a scalable rack fluid network, a rack filtration unit, and automated rack flow balancing, and a service mode.

According to one embodiment, liquid rail 924 includes a series of secondary conduits, such as supply divert conduit 997 and return divert conduit 998 that provides a by-pass fluid path for each of MLD conduits 978. In operation, divert conduit 997 allows for the removal of corresponding MLD conduit 978, thus removing the flow of cooling liquid to the particular block of nodes, without interrupting the flow of cooling liquid to the other surrounding blocks of computer gear. For example, a particular MLD conduit 978 can be replaced due to a leak. For another example, a block liquid manifold 989 can be replaced. The inclusion of divert conduits 997, 998 thus enables rapid servicing and maintenance of block liquid manifold 989 and/or nodes within block chassis without having to reconfigure the MLD conduits 978. In addition, the RIHS 900 can continue operating as cooling liquid continues to be provided to the remainder of the blocks that are plugged into the liquid rail. Reinsertion of the MLD conduit 978 then reconnects the flow of cooling liquid to the block for normal cooling operations, and shuts off the diverted flow of cooling liquid. In an exemplary embodiment, the MLD conduits 978 provide a quick disconnect feature that interrupts flow when not fully engaged to a respective port 917, 919, 921, 923. Disconnection of an MLD conduit 978 interrupts flow in a primary portion of the liquid rail 924 for either supply or return, shifting flow through one or more divert conduits 997 to provide cooling liquid to the other block liquid manifolds 989. In one or more embodiments, a manual or active shutoff valve can interrupt flow on either or both of the primary or divert portions of the liquid rail 924.

Figure 10:
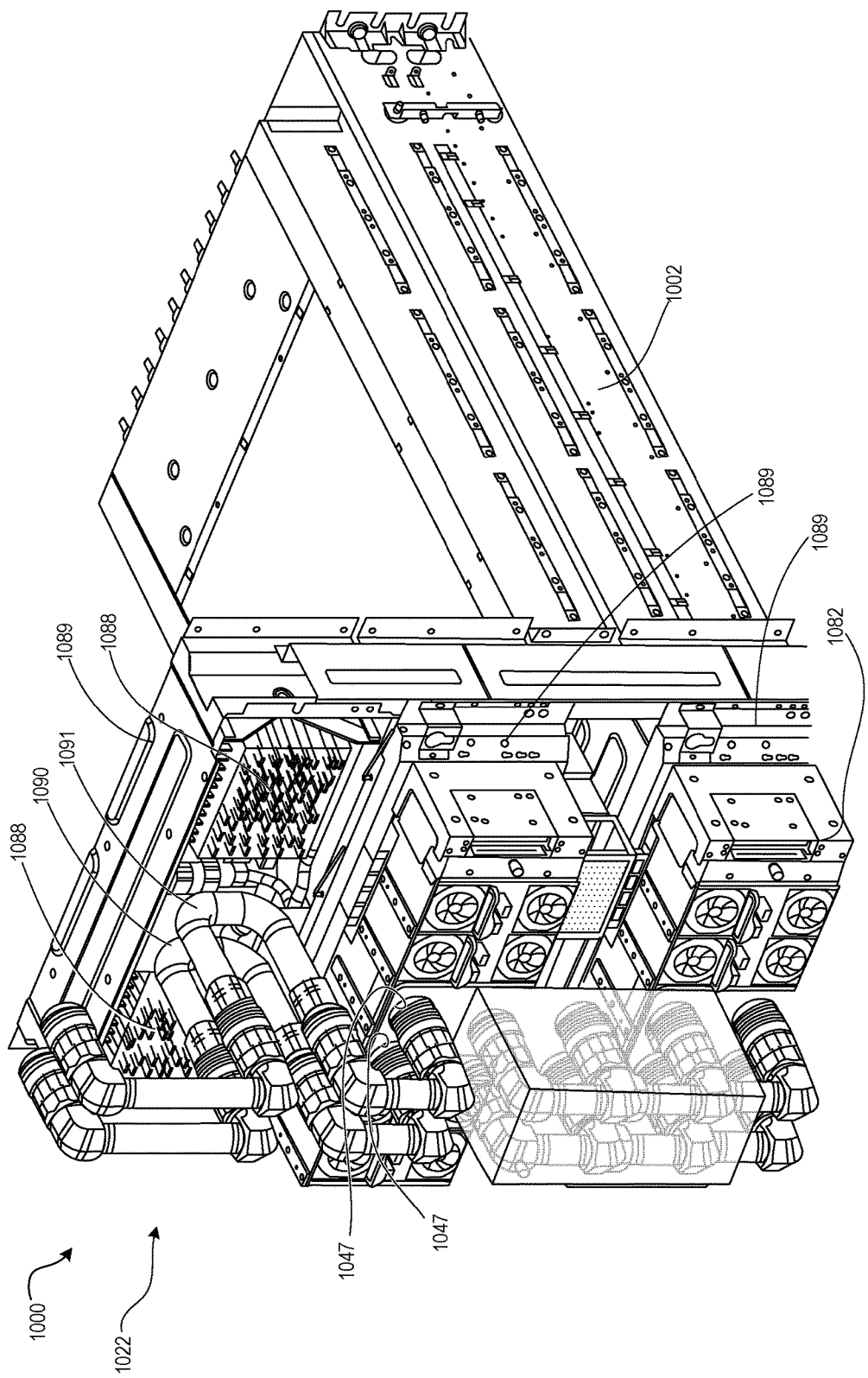
FIG. 10 illustrates a perspective view of a portion of a DL RIHS depicting example nodes, block radiators with Air-Liquid heat exchangers, and MLD conduits, according to one or more embodiments.

FIG. 10 illustrates a more detailed view of the internal makeup of the rails and other functional components of the cooling subsystem 1022 of example RIHS 1000. According to one embodiment, cooling subsystem 1022 also includes air movers and/or other devices to provide for forced air cooling in addition to the direct injection liquid cooling. As shown by FIG. 10, at least one fan module 1082 is rear mounted to a block liquid manifold 1089 in which an air-to-liquid heat exchanger (or radiator) 1088 is incorporated. Fan module 1082 provides air movement through chassis 1010 and/or node enclosure 1008 of node 1002 as well as through air-to-liquid heat exchanger 1088. Each block liquid manifold 1089 includes supply bypass tube 1090 and return bypass tube 1091 through which a dynamically determined amount of cooling liquid is directed into respective node 1002 while allowing a bypass flow to proceed to the next node/s 1002 in fluid path of the intake flow. Fan module 1082 includes apertures 1047 through which supply bypass tubes 1090 and return bypass tubes 1091 are extended, according to one embodiment. Nodes 1002 are connected into the backside of block liquid manifold 1089 with the ends of intake and exhaust liquid transfer conduits in sealed fluid connection with supply bypass tubes 1090 and return bypass tubes 1091, respectively.

Liquid Flow Control Management for Shared Infrastructure Servers

Figure 11:
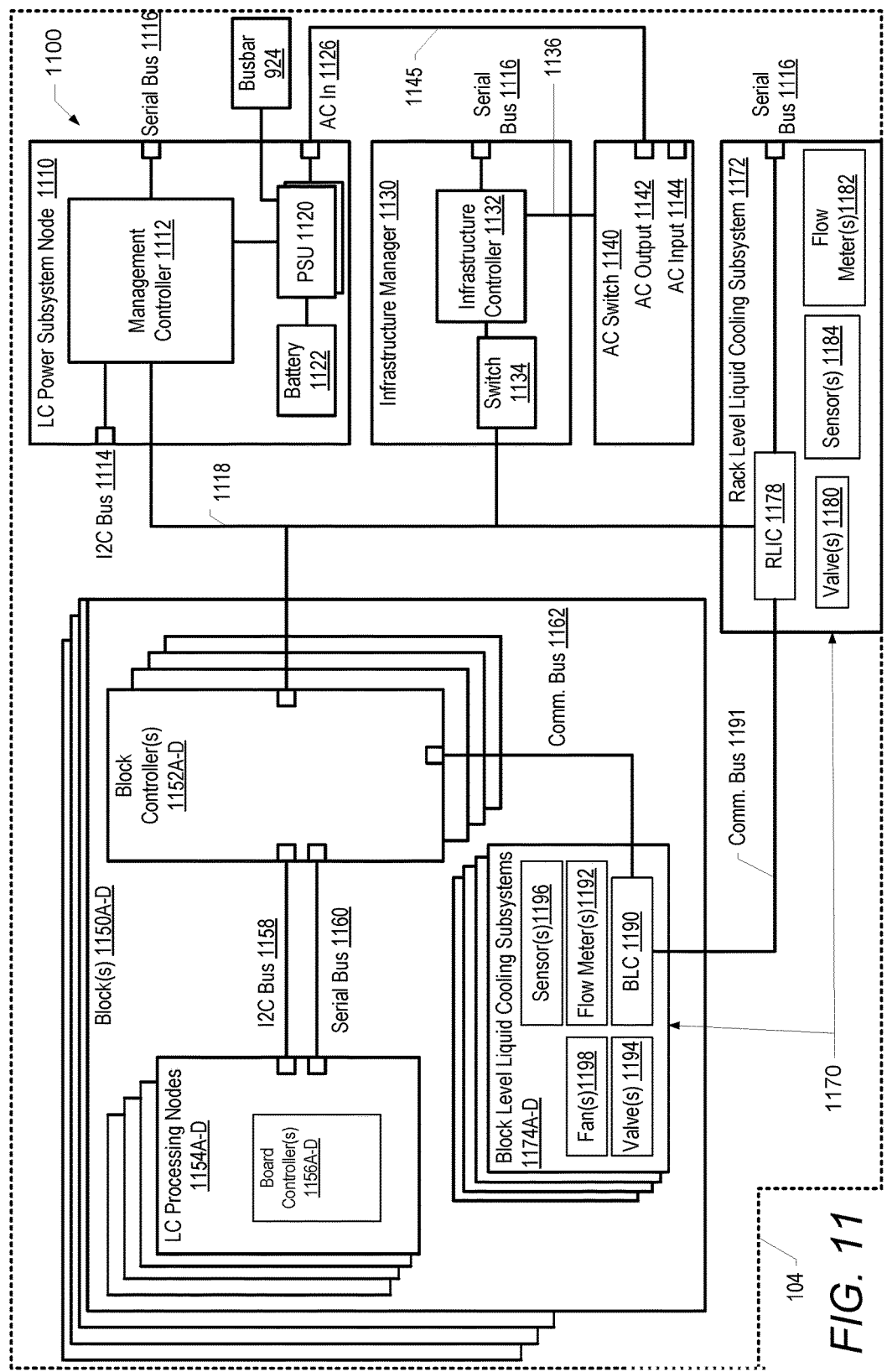
FIG. 11 is a block diagram illustration of an example DL RIHS, according to one or more embodiments.

FIG. 11 illustrates a block diagram representation of an example DL RIHS 1100, within which one or more of the described features of the various embodiments of the disclosure can be implemented. Referring specifically to FIG. 11, there is illustrated a two-dimensional block diagram of an example DL RIHS 1100 configured within a liquid-cooled, modular, expandable rack with modular configuration of various functional components inserted therein. DL RIHS 1100 includes rack 104, which can comprise one or more panels of sheet metal or other material interconnected to form a three dimensional volume (as illustrated in FIGS. 3-7), which is generally referred to in the industry as a rack. The various components are communicatively connected to one or more other components via power and communication cables (or buses), which are generally represented by the connecting lines of FIG. 11 (e.g. communication bus 1191, communication bus 1162, serial bus 1160). DL RIHS 1100 comprises a hierarchical arrangement of liquid-cooled processing nodes, liquid-cooled power subsystem nodes and other functional processing components or IT gear located within end nodes or servers.

In the illustrated embodiment, in addition to the previously introduced LC server nodes, DL RIHS 1100 comprises an LC power subsystem node 1110, which includes a management controller (MC) 1112 communicatively connected to one or more power supply units (PSUs) 1120. In one embodiment, PSUs 1120 are liquid cooled. MC 1112 can receive power supply data and settings from PSUs 1120. PSUs 1120 are connected to alternating current (AC) input power terminal 1126 that provides a source of AC power to PSUs 1120. Backup battery 1122 is connected to PSUs 1120 to supply backup system power in case of a loss of primary power (e.g., AC power) to DL RIHS 1100. AC switch 1140 controls the connection of AC power to DL RIHS 1100. AC switch 1140 has an AC input terminal 1144 and an AC output terminal 1142. An AC power cable 1145 is connected between, and supplies AC power from, AC switch 1140 to PSUs 1120.

MC 1112 is communicatively connected to communication bus 1118 and an I2C bus 1114. In one embodiment, communication bus 1118 can be an Ethernet cable providing connection via an Ethernet network. Communication bus 1118 is communicatively connected between MC 1112 and switch 1134 of infrastructure manager (IM) 1130. Switch 1134 of Infrastructure manager (IM) 1130 is communicatively connected to IM controller 1132. Switch 1134 enables IM controller 1132 to communicate with block controllers 1152A-D via communication bus 1118. According to at least one embodiment, MC 1112 and IM 1130 provide certain control and/or management signals to block controllers 1152A-D via communication bus 1118. IM controller 1132 is communicatively connected to AC switch 1140 and to serial bus 1116.

DL RIHS 1100 further comprises a plurality of processing blocks 1150A-D. Within the description, the term processing block or block are synonymous, and can be utilized interchangeably, with a "chassis" or "block chassis" that can hold multiple servers/nodes/sleds, etc. Processing blocks 1150A-D comprise block controllers 1152A-D, LC processing nodes 1154A-D and block-level liquid cooling subsystems 1174A-D. Each of block controllers 1152A-D are communicatively connected to communication bus 1118. Within each block 1150 is at least one, and likely a plurality of LC processing nodes 1154A-D, generally referred to as LC nodes 1154A-D, and synonymous with the previously-introduced LC nodes within the previous figures. As one aspect of the disclosure, the number of nodes that can be placed within each block and/or can be supported by a single block controller, and can vary based on the block dimension and relative to the size and configuration of each processing node. Additionally, one or more of the blocks can be utilized to provide rack-storage of storage devices. Each LC node 1154 that is controlled by a respective block controller 1152 is communicatively coupled to block controller 1152 via an I2C bus 1158 and a serial bus 1160. Each LC node 1154A-D includes board controller 1156A-D (synonymous with node controller 118, FIG. 1) that can control one or more aspects of the operation of that LC node 1154A-D.

DL RIHS 1100 further comprises a liquid cooling control subsystem 1170 that includes a rack-level liquid cooling subsystem 1172 and block-level liquid cooling subsystems 1174A-D. In one embodiment, control components of rack-level liquid cooling subsystem 1172 are physically located on a liquid instrumentation management circuit board and control components of block-level liquid cooling subsystems 1174A-D are physically located on a block liquid control circuit board. Rack-level liquid cooling subsystem 1172 controls the overall liquid cooling of DL RIHS 1100, while block-level liquid cooling subsystems 1174A-D control the liquid cooling of individual blocks 1150A-D and the LC nodes within the particular block.

Rack-level liquid cooling subsystem 1172 includes a rack-level liquid infrastructure controller (RLIC) 1178 that is communicatively coupled to each of block controllers 1152 via communication bus 1118 and to each of the block-level liquid cooling subsystems 1174A-D via communication bus 1191. RLIC 1178 is synonymous with and provides the same functionality as liquid infrastructure controller (LIC) 886 (FIG. 8). Similarly, block controller 1152 can be synonymous with and provide the same or overlapping functionality as block liquid controllers (BLCs) 887 (FIG. 8). RLIC 1178 is also communicatively coupled to serial bus 1116 for communication with MC 1112.

Rack-level liquid cooling subsystem 1172 further includes one or more proportional supply valves 1180, one or more sensors 1184, and one or more flow meters 1182. RLIC 1178 is communicatively coupled to supply valve 1180, sensors 1184 and flow meters 1182. In one embodiment, supply valve 1180 can control an incoming cooling liquid supply flow rate to DL RIHS 1100. In another embodiment, supply valves can control an incoming or an outgoing (return) cooling liquid supply rate of DL RIHS 1100. Sensors 1184 can be temperature sensors that record temperature within DL RIHS 1100. Flow meters 1182 can measure flow rates of cooling liquid within DL RIHS 1100. RLIC 1178 can receive electrical signals containing data and measurements from supply valve 1180, sensors 1184, and flow meters 1182. Also, RLIC 1178 can transmit electrical signals and/or communicate data, instructions and settings to supply valve 1180, sensors 1184, and flow meters 1182.

Each of the block-level liquid cooling subsystems 1174A-D includes block liquid controller (BLC) 1190 (implemented as a block liquid control board (BLCB)) that is communicatively coupled to a respective block controller 1152 via communication bus 1162 and to RLIC 1178 via communication bus 1191. Within the description herein, the BLCB is also referred to generally as a block liquid controller 1190. Block-level liquid cooling subsystems 1174A-D further include one or more proportional liquid control valves 1194, one or more sensors 1196, one or more flow meters 1192, and one or more fan modules 1198.

BLC 1190 is communicatively coupled to proportional liquid control valves 1194, sensors 1196, flow meters 1192, and fan modules 1198. In one embodiment, proportional liquid control valves 1194 can regulate, adjust and control an incoming cooling liquid supply flow rate to blocks 1150, and by extension to the nodes within the particular block. Alternatively and/or in addition, proportional liquid control valves 1194 can control an outgoing (return) cooling liquid supply rate. In an embodiment, sensors 1196 can be temperature sensors that sense temperatures within LC processing nodes 1154 and flow meters 1192 can measure flow rates of cooling liquid within blocks 1150. BLC 1190 can receive electrical signals containing data and measurements from proportional liquid control valves 1194, sensors 1196, flow meters 1192, and fan modules 1198. BLC 1190 can also transmit electrical signals containing data, instructions and settings to proportional liquid control valves 1194, sensors 1196, flow meters 1192, and fan modules 1198.

According to one aspect of the disclosure, block controller 1152 performs the majority of the operations at the block level, including the calculations described herein and presented in the flow charts. The BLC 1190 operates more as a pass-through device for implementing flow control aspects based on input received from block controller 1152. During flow control operations, BC 1152 provides signals to BLC 1190 informing BLC 1190 of what values to set the block valves to. BC 1152 calculates and triggers BLC to issue PWM values that are forwarded and/or transmitted to the corresponding block valve(s). BC also provides control signals for other PWM modules that control the one or more air movers (e.g., fans). It is appreciated that in some embodiments, the functionality of a block controller 1152 and a block liquid controller 1190 can be provided by a single controller module, rather than separate modules. Additionally, in alternate embodiments, some of the functions described as being performed by the block controller 1152 can in fact be performed by the block liquid controller 1190. Thus, the description herein of specific functions being performed by specific controllers is not intended to imply any limitations on these two controllers and/or the overall disclosure.

According to one aspect of the disclosure, liquid cooling control subsystem 1170 and specifically RLIC 1178 can receive an incoming cooling liquid supply flow rate corresponding to an amount and rate of incoming cooling liquid supply being supplied to DL RIHS 1100. The flow rate can be measured by flow rate meter 1192. RLIC 1178 calculates a maximum flow rate cap for each of block of LC nodes 1154A-D and transmits the maximum flow rate cap to each block controller of a respective block the LC nodes. RLIC 1178 triggers each block controller to adjust the block controller's respective flow rates to correspond to the received maximum flow rate cap for that block.

One aspect of the disclosure is an appreciation that to ensure effective cooling of the DL RIHS 1100, it may be necessary to adjust the cooling liquid flow rates to the overall DL RIHS 1100 and to also adjust the cooling liquid flow rates to individual blocks, processing nodes and components of DL RIHS 1100. In particular, it may be necessary to provide real-time increases of cooling liquid flow rates to LC nodes 1154A-D and/or blocks containing LC nodes 1152A-D that are consuming high levels of power and thus generating higher than normal/average levels of heat.

Figure 12:
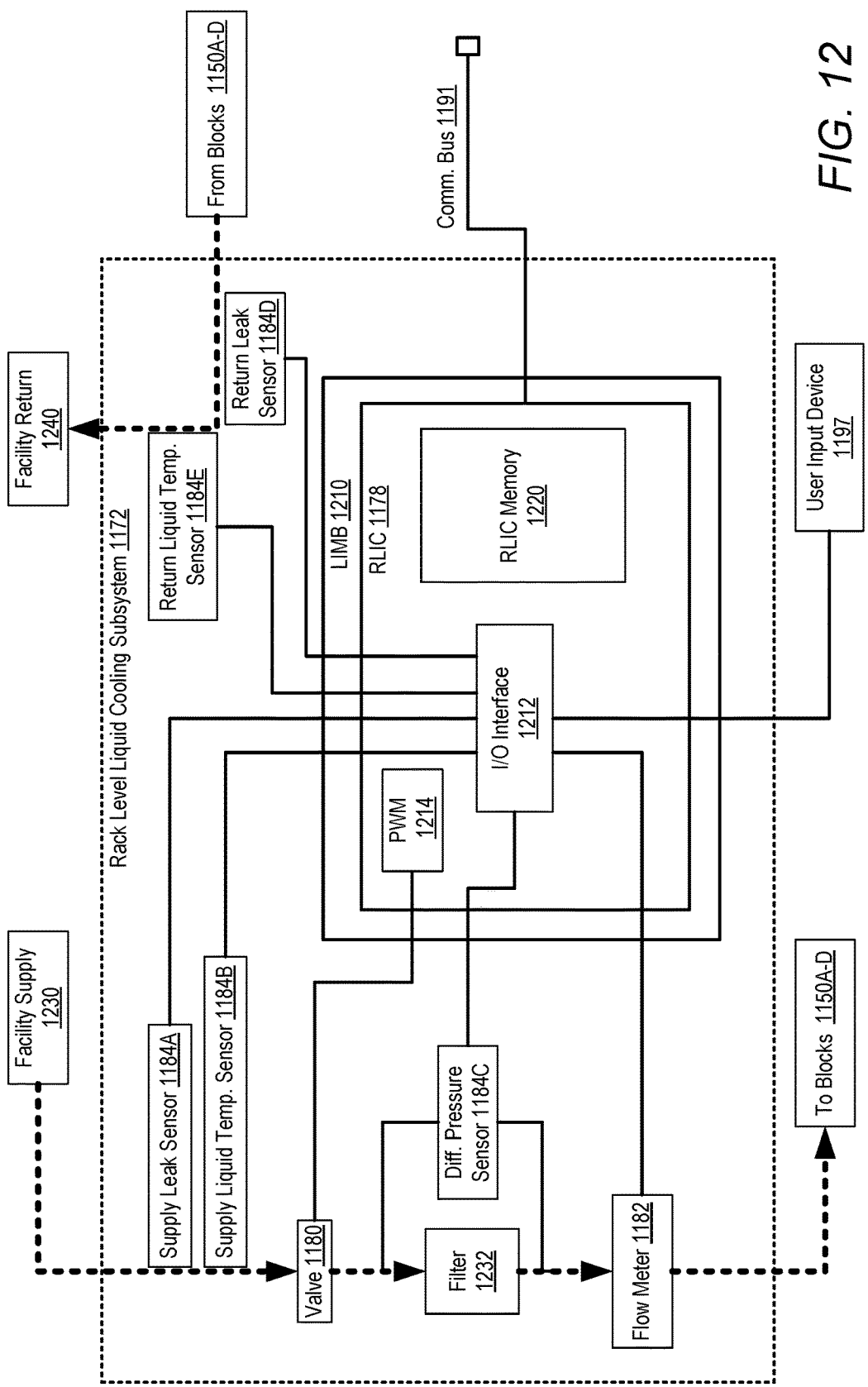
FIG. 12 is a block diagram illustrating the connectivity of components within a rack-level cooling subsystem for controlling liquid cooling of LC nodes in a DL RIHS via a rack-level liquid cooling infrastructure controller, in accordance with one embodiment.

FIG. 12 illustrates further details of the connectivity of functional components within a rack level liquid cooling subsystem 1172 for controlling liquid cooling of LC nodes 1154A-D within DL RIHS 1100 (of FIG. 11). Within the figure, signal and/or data communication buses are shown connecting the various sensors and valves to RLIC 1178 and/or components within RLIC 1178, while liquid conduits are presented as dotted lines with directional arrows indicate a direction in which cooling liquid flows. Rack level liquid cooling subsystem 1172 includes RLIC 1178 that is physically located on liquid instrumentation management circuit board (LIMB) 1210. RLIC 1178 includes I/O interface 1212, pulse width modulation (PWM) circuit 1214, and RLIC memory 1220. In one embodiment, RLIC memory 1220 can be a non-volatile memory device such as flash memory. RLIC memory 1220 can store algorithms and firmware that, when executed by RLIC 1178, perform one or more of the processes and methods described herein. PWM circuit 1214 generates PWM signals that can control the operation of connected devices such as the position of proportional supply valve 1180. I/O interface 1212 enables communication between RLIC 1178 and other connected devices such as valves, sensors, and flow meters.

Facility supply 1230 is a source of cooling liquid for DL RIHS 1100. In one embodiment, cooling liquid provided by facility supply 1230 can be water. Facility supply 1230 is in fluid communication with supply valve 1180. Supply valve 1180 is in fluid communication with filter 1232, via input flow rate control valve 1180. In one embodiment, filter 1232 is synonymous with hot-pluggable filtration subunit (FRU) 937 (FIG. 9). Filter 1232 can remove contaminants or particulates from the cooling liquid. Filter 1232 is in fluid communication with flow meter 1182, which is in fluid communication with liquid cooling components of blocks 1150A-D via the liquid rail (not shown). Flow meter 1182 measures the flow rate of cooling fluid into RIHS.

From a block-level perspective, cooling liquid flows from incoming facility supply 1230, through supply valve 1180, filter 1232, and then on to liquid cooling components of blocks 1150A-D. After the cooling liquid has removed heat from blocks 1150A-D, the cooling liquid flows to facility return 1240. According to one or more embodiment, the cooling liquid received at facility return 1240 can be recirculated for use or discarded or otherwise used at the facility.

The incoming flow rate of cooling liquid to DL RIHS 1100 can be regulated by supply valve 1180. Supply valve 1180 is communicatively coupled to PWM circuit 1214. Supply valve 1180 can be placed in different states of openness, ranging from fully closed (with no liquid flow) to fully open (for full or maximum liquid flow). RLIC 1178 can control the open state/position of (and thus the liquid flow rate permitted through) supply valve 1180, thereby regulating the flow rate and amount of cooling liquid being supplied to DL RIHS 1100.

I/O interface 1212 is further communicatively coupled to supply leak sensor 1184A, supply liquid temperature sensor 1184B, and differential pressure sensor 1184C. Supply leak sensor 1184A can detect leaks in facility supply 1230. Liquid temperature sensor 1184B can measure the temperature of the incoming cooling liquid and provide an electrical signal proportional to the temperature of the incoming cooling liquid. Differential pressure sensor 1184C measures the pressure drop across filter 1232 and provides an electrical signal proportional to the differential pressure. According to one aspect, RLIC 1178 can determine that filter 1232 is clogged if the differential pressure received from differential pressure sensor 1184C falls below a pre-determined value.

I/O interface 1212 is further communicatively coupled to flow meter 1182. Flow meter 1182 can measure a flow rate of cooling liquid being supplied to DL RIHS 1100 and provide an electrical signal proportional to the flow rate to RLIC 1178 via I/O interface 1212. I/O interface 1212 is further communicatively coupled to return leak sensor 1184D and return liquid temperature sensor 1184E. Return leak sensor 1184D can detect leaks in facility return 1240. Return liquid temperature sensor 1184E can measure the temperature of the return (outgoing) cooling liquid exiting from RIHS and provide an electrical signal proportional to the temperature of the return cooling liquid. A user input device 1197 is communicatively coupled to I/O interface 1212. In one embodiment, user input device 1197 can include a keyboard, mouse and/or touch pad. User input device 1197 can allow an IT manager or system administrator to input a desired exterior ambient temperature for a rack or block and to modify that value as needed.

Figure 13:
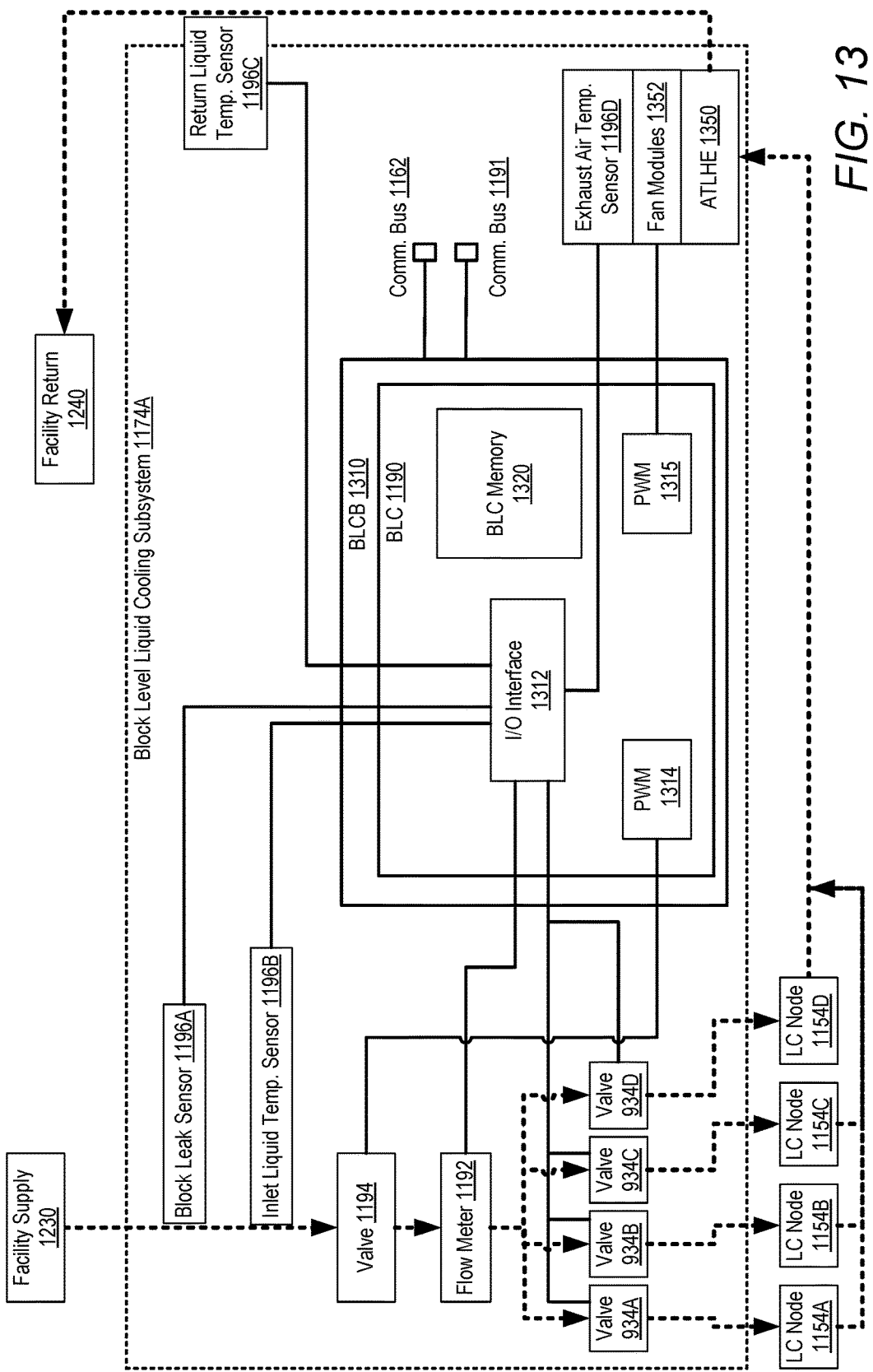
FIG. 13 is a block diagram illustrating the connectivity of components within a block level cooling subsystem for controlling liquid cooling of LC nodes in a DL RIHS via a block liquid controller, in accordance with one or more embodiments.

FIG. 13 illustrates further details of the connectivity of functional components within block-level liquid cooling subsystem 1174 and specifically within block-level liquid cooling subsystem 1174A that controls liquid cooling of LC processing nodes within DL RIHS 1100 (of FIG. 11). Within the figure, signal and/or data communication buses are shown connecting the various sensors and valves to BLC 1190 and/or components within BLC 1190, while liquid conduits are presented as dotted lines with directional arrows indicate a direction in which cooling liquid flows. Block-level liquid cooling subsystem 1174A includes BLC 1190, which is physically located on block liquid circuit board (BLCB) 1310. BLC 1190 includes I/O interface 1312, pulse width modulation (PWM) circuit 1314, PWM circuit 1315, and BLC memory 1320. In one embodiment, BLC memory 1320 can be a non-volatile memory device such as flash memory. BLC memory 1320 can store algorithms and firmware that, when executed by BLC 1190, enables BLC 1190 to perform one or more of the processes and methods described herein. PWM circuit 1314 generates PWM signals that can control the operation of connected devices, such as the open position of liquid control valve 1194. PWM circuit 1315 generates PWM signals that can control the operation of connected devices, such as the speed at which air movers, such as fan modules 1194, operate. I/O interface 1312 enables communication between BLC 1190 and other connected devices such as valves, sensors, and flow meters.

As described herein, facility supply 1230 provides cooling liquid for each of the blocks 1150A-D. Specifically, facility supply 1230 provides cooling liquid that is in fluid communication with block liquid control valve 1194. The block liquid control valve 1194 is in fluid communication with flow meter 1192, which is in fluid communication with the LC processing nodes 1154A-D.

At the block and node levels, the flow path of cooling liquid runs from facility supply 1230, through block liquid control valve 1194, through flow meter 1192, through node input valves 934A-D (synonymous with node valves 134, FIG. 1) and then on to liquid cooled components associated with and located within LC nodes 1154A-D. LC nodes 1154A-D respectively include node-level input valves 934A-D and check valves 936, and each LC node includes a system of conduits extending through the LC node, as provided above in the description of the preceding figures (e.g., FIGS. 2 and 9). The cooling liquid flows through the LC nodes' system of conduits and absorbs and removes heat from within LC nodes 1154A-D. In one embodiment, the cooling liquid also flows to the air-to-liquid heat exchanger (ATLHE) 1350. In a closed loop configuration, ATLHE 1350 is mounted to each of LC nodes 1154A-D. Each ATLHE 1350 receives cooling liquid returning from LC processing nodes 1154A-D and the cooling liquid is passed through a heat exchanger that is cooled by a variable air flow supplied by one or more fan modules 1352. After exiting ATLHE 1350, the cooling liquid returns to facility return 1240.

The flow rate of cooling liquid within block 1150A (of FIG. 12) can be regulated by liquid control valve 1194, which is mounted in the proximity to block 1150A. Liquid control valve 1194 is communicatively coupled to PWM circuit 1314. BLC 1190 can control the open position of (and flow rate supported by) liquid control valve 1194 by regulating a PWM signal to valve 1194. BLC 1190 is thus able to regulate the flow rate of cooling liquid being supplied to LC processing nodes 1154A-D.

I/O interface 1312 is communicatively coupled to block leak sensor 1196A, a block inlet liquid temperature sensor 1196B, and exhaust air temperature sensor 1196D. Block leak sensor 1196A can detect cooling liquid leaks within block 1150A. Block inlet temperature sensor 1196B can measure the temperature of the cooling liquid entering block 1150A (of FIG. 12) and provide an electrical signal proportional to the temperature of the incoming cooling liquid. Exhaust air temperature sensor 1196D can measure the temperature of the exhaust air leaving ATLHE 1350 and provide an electrical signal proportional to the temperature of the exhaust air.

Fan modules 1352 of ATLHE 1350 are communicatively coupled to PWM circuit 1314. BLC 1190 can control the fan speed of fan modules 1352 by regulating a PWM signal to fan modules 1352. By regulating the PWM signal to fan modules 1352, BLC 1190 regulates the air flow rate of cooling air being supplied to ATLHE 1350.

I/O interface 1312 is further communicatively coupled to flow meter 1192. Flow meter 1192 can measure a flow rate of cooling liquid flowing through block 1150A and provide an electrical signal proportional to the flow rate to BLC 1190 via I/O interface 1312. I/O interface 1312 is further communicatively coupled to return liquid temperature sensor 1196C. Return liquid temperature sensor 1196C can measure the temperature of the return (outgoing) cooling liquid from block 1150A and provide an electrical signal proportional to the temperature of the return cooling liquid.

In one embodiment, node input valves 934A-D can be open/close or on/off valves that can be set to only one of two positions. In this embodiment, node input valves 934A-D are configured to be fully open unless closed by block controller or node controller following detection of a leak within the specific node. The flow rate of cooling liquid through each node is then determined based on the maximum flow rate provided to the proportional valve serving the particular block of nodes. In an alternate embodiment that supports granular node-level flow control, the flow rate of cooling liquid within each of the LC processing nodes 1150A-D can be regulated by node input valves 934A-D. In this embodiment, node input valves 934A-D are proportional valves and are communicatively coupled to PWM circuit 1314. Accordingly, BLC 1190 can control the open position of (and flow rate supported by) of each of the node input valves 934A-D by regulating a PWM signal to the valves. BLC 1190 is thus able to granularly regulate the flow rate of flow and/or amount of cooling liquid being supplied to each of LC processing nodes 1154A-D.

Figure 14:
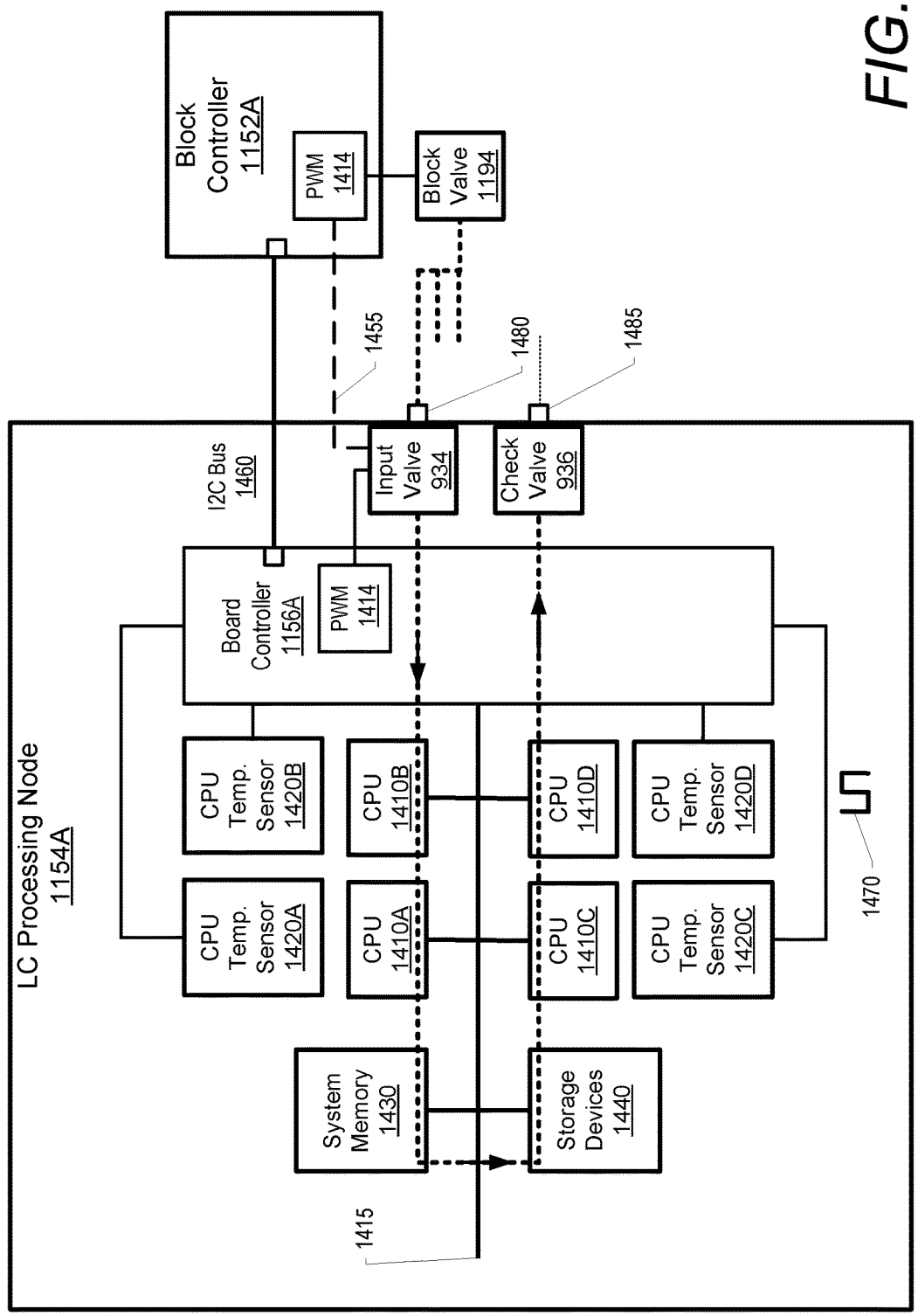
FIG. 14 is a block diagram further illustrating the connectivity of components within the DL RIHS and specifically further illustrates components of an LC processing node, in accordance with one embodiment.

With reference now to FIG. 14, there is illustrated one embodiment of a single LC node 1154 and, in particular, LC node 1154A. In the illustrative embodiments, LC node 1154A includes a chassis on and/or within which the components of LC node are installed. The chassis, or sled, as it is also called, can be slid into and out of the chassis receiving front bay of the block chassis. LC processing node 1154A comprises one or more processors or central processing units (CPUs) 1410A, 1410B, 1410C and 1410D, (collectively CPUs 1410A-D) that are communicatively connected to a system memory 1430 and storage device(s) 1440 via a system bus 1415. Storage device(s) 1440 can be utilized to store one or more software and/or firmware modules and/or data (not specifically shown). In one embodiment, storage device(s) 1440 can be a hard drive or a solid-state drive. In some embodiments, LC node 1150 can actually be a storage node providing a sled in which a large number of storage devices are hosted, where the storage devices are specifically configured to store mass amounts of data.

CPUs 1410A-D are also communicatively connected to board controller 1156A via system bus 1415. In one embodiment, board controller 1156A can reside on a motherboard that also contains CPUs 1410A-D. Board controller 1156A is communicatively connected to block controller 1152A by I2C bus 1460. Board controller 1156A can facilitate communication between CPUs 1410A-D and block controller 1152A. Board controller 1156A can include PWM circuit 1414 that is communicatively coupled to node level input valve 934. In one embodiment PWM circuit 1414 can be located within block controller 1152A and can be communicatively coupled to node level input valve 934 via one or more cables or signal buses 1455. Block valve 1194 is in fluid communication with input valve 934 via node liquid supply port 1480. LC node 1154A includes a check valve 936 that has a node liquid return port 1485. LC node 1154A receives cooling liquid via node liquid supply port 1480 and input valve 934. The CPUs, system memory and storage devices are cooled by the circulating cooling liquid. The cooling liquid exits LC node 1154A via check valve 936 and node liquid return port 1485.

LC node 1154A further includes temperature sensors 1420A, 1420B, 1420C and 1420D, (collectively temperatures sensors 1420A-D) that are communicatively connected to board controller 1156A. In the illustrative embodiment, temperatures sensors 1420A-D are mounted in thermal contact with CPUs 1410A-D such that temperature sensors 1420A-D can accurately measure the operating temperatures of CPUs 1410A-D. Temperature sensors 1420A-D can measure the temperature of their respective CPU and provide an electrical signal (temperature sensor signal 1470) that is proportional to the measured temperature to board controller 1156A. Board controller 1156A can receive temperature sensor signal 1470 and transmit temperature sensor signal 1470 to block controller 1152A, which can transmit temperature sensor signal 1470 to BLC 1190 (of FIG. 13).

In one embodiment, BLC 1190 can receive temperature sensor signal 1470 from each of CPUs 1410A-D associated with LC processing nodes 1154A-D, within a respective block 1150A-D of FIG. 11. BLC 1190 can identify a highest magnitude temperature from among the received temperature sensor signals 1470 for each of LC processing nodes 1154A-D within the respective block. BLC 1190 can retrieve, from BLC memory 1320, a first operating temperature set point associated with the LC node having the highest magnitude temperature within that block. BLC 1190 then calculates a liquid flow rate for the block of LC processing nodes 1154A-D based on the highest magnitude temperature value and the first operating temperature set point. BLC 1190 then triggers PWM circuit 1114 to open block valve 1194 to allow sufficient liquid flow (within the maximum flow rate allowed for that block) to cool the particular CPU having the highest magnitude temperature. With this directed cooling, BLC 1190 is then able to maintain the set points for all CPUs within the block. In the node-level granular control embodiments, BLC 1190 can trigger each of the LC nodes to move their respective liquid control valves 934A-D (i.e. via individual PWM circuits providing signals to the respective valves 934A-D) to an open position FIGS. 15A and 15B further illustrate details of example contents of RLIC memory 1220 and BC-BLC memory 1320. With specific reference to FIG. 15A, RLIC memory 1220 can store rack-level liquid cooling control (RLLCC) firmware 1510, which is inclusive of the firmware that controls the rack-level liquid cooling of DL RIHS 1100. RLIC memory 1220 stores a current incoming cooling liquid supply flow rate 1520, as measured by and received from flow meter 1182. RLIC memory 1120 also stores a fully-open cooling liquid supply flow rate 1522, which is measured by and received from flow meter 1182 when supply valve 1180 is in fully open position. RLIC memory 1220 also stores a supply cooling liquid temperature 1524, which is measured by and received in real time from supply liquid temperature sensor 1184B. RLIC memory 1120 also includes a return cooling liquid temperature 1526, which is measured by and received from return liquid temperature sensor 1184E.

RLIC memory 1220 further contains maximum flow rate caps 1528 calculated by RLIC 1178 for each of blocks 1150A-D, of FIG. 11. In one embodiment, rack flow rate algorithm 1540 maintains the distribution of liquid coolant between blocks 1150A-D within DL RIHS 1100 by capping the maximum flow rate that each of the block consumes. In the illustrated embodiment, maximum flow rate caps 1528 represent an array of values, with a different entry in the array for each block 1150A-D. RLIC memory 1220 also contains first block flow rates 1530, second block flow rates 1532 and third block flow rates 1534. First block flow rates 1530 are a pre-determined percentage of a fully open supply valve (1180) flow rate for each of blocks 1150A-D. Second block flow rates 1532 are measured by flow rate meter 1182 for each of blocks 1150A-D when supply valve 1180 has been set to the first block flow rates 1530. Third block flow rates 1534 are measured by flow rate meter 1182 for each of blocks 1150A-D during operation of DL RIHS 1100.

RLIC memory 1220 further contains a rack flow rate algorithm 1540 and default maximum flow rate cap 1544. Rack flow rate algorithm 1540 is used by RLIC 1178 to calculate maximum flow rate caps 1528. Default maximum flow rate caps 1544 are the default maximum flow rate caps for each of blocks 1150A-D and which are used/applied when an error occurs in the calculation of maximum flow rate caps 1528.

Figures 15A, 15B:
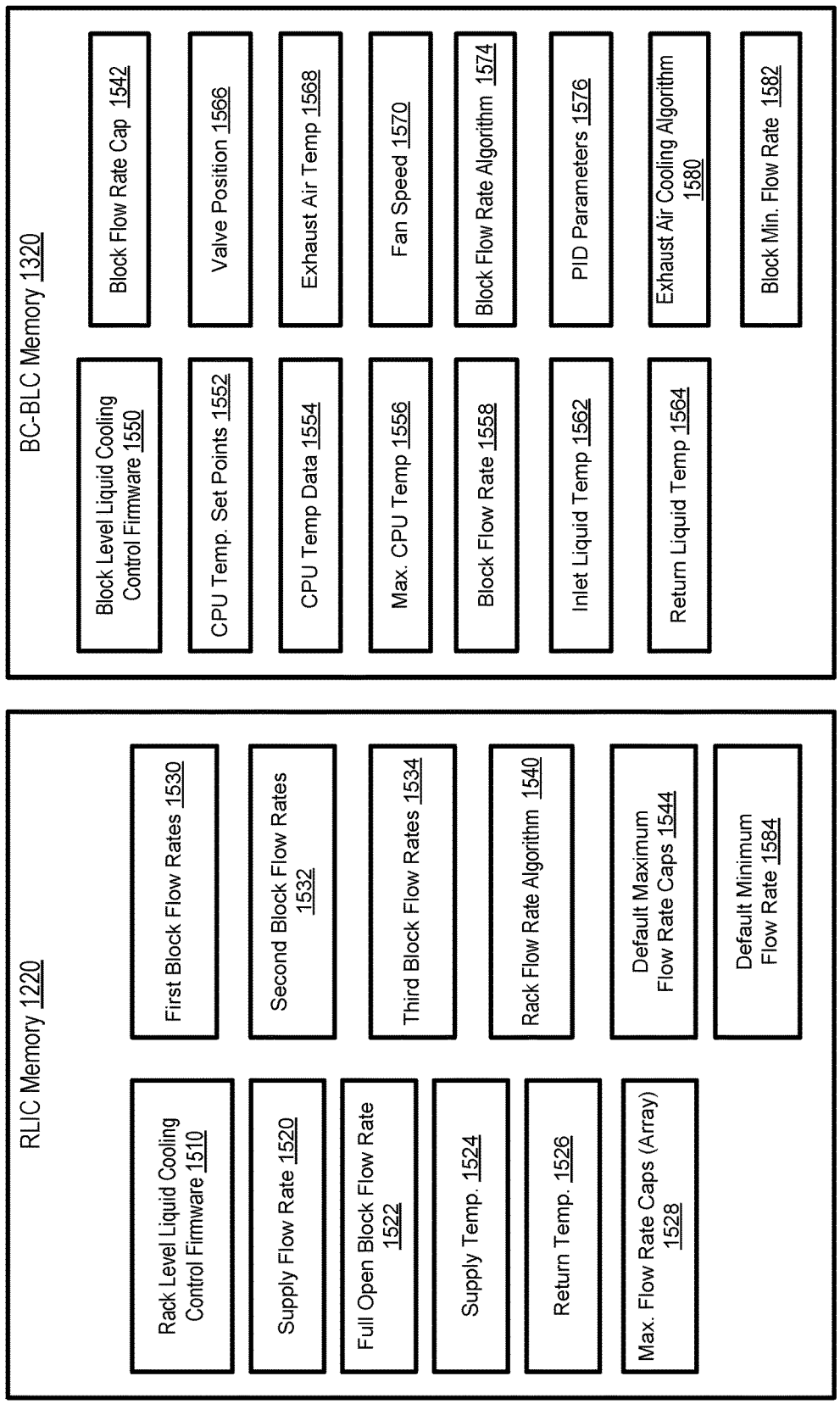
FIG. 15A is a block diagram illustrating example contents of the liquid cooling infrastructure controller memory, in accordance with one or more embodiments.
FIG. 15B is a block diagram illustrating example contents of the block liquid controller memory, in accordance with one embodiment.

FIG. 15B illustrates contents of BC-BLC memory 1320, which includes components utilized by BC 1152 and, where appropriate BLC 1190, during liquid cooling operations. BC-BLC memory 1320 can represent memory of BC 1152 and/or of BLC (1190). For simplicity, the memory 1320 is hereinafter referred to as BC-BLC memory 1320 although, it is understood that the majority of the components therein are utilized primarily by BC 1152 to provide liquid cooling to the corresponding block utilizing BLC 1190 in some instances. It is appreciated that the illustrated BC-BLC memory 1320 can generally be described as the memory of BC 1152 as the firmware and data values are ones utilized during computations performed primarily by BC 1152. The presentation as a single memory is solely to simplify the description, as the same memory component may also store information utilized by BLC 1190. BC-BLC memory 1320 can store block-level liquid cooling control (BLCC) firmware 1550, which is inclusive of the firmware that controls the block-level liquid cooling of DL RHIS 1100. BC-BLC memory 1320 stores block flow rate caps 1542 for each block, and CPU temperature set points 1552 for each of the CPUs within that block of DL RIHS 1100. In one embodiment, BC-BLC memory 1320 also stores CPU temperature data 1554 for each of the CPUs within DL RIHS 1100 and a maximum CPU temperature 1556. CPU temperature set points 1552 are the pre-determined maximum allowed temperature for each of the CPUs within DL RIHS 1100. CPU temperature data 1554 are temperatures measured by CPU temperature sensors 1420A-D for the CPUs within DL RIHS 1100. Maximum CPU temperature 1556 is the highest CPU temperature from among the measured CPU temperature data 1554.

BC-BLC memory 1320 also contains block flow rate 1558 measured by and received from flow meter 1192, inlet cooling liquid temperature 1562 measured by and received from inlet liquid temperature sensor 1196B, and return cooling liquid temperature 1564 measured by and received from return liquid temperature sensor 1196C.

BC-BLC memory 1320 further contains a valve position 1566, exhaust air temperatures (temps) 1568, and fan speeds 1570. Valve position 1566 is the current proportional position of valve 1194. Exhaust air temps 1568 are the exhaust air temperatures measured and received from each of the exhaust air temperatures sensors 1196D. Fan speeds 1570 are the current fans speeds of each of the fans 1152. BC-BLC memory 1320 further also stores block flow rate minimization algorithm 1574, PID parameters 1576, and block liquid minimum flow rates 1582. Block flow rate minimization algorithm 1574 is used by BC 1152 to calculate the minimum flow rate to each of blocks 1150A-D. PID parameters 1576 are constants used in block flow rate minimization algorithm 1574. The PID parameters 1576 can be different for each of blocks 1150A-D and can be assigned separate values in BLC memory 1320. BC-BLC memory 1320 further contains an exhaust air cooling algorithm 1580. Exhaust air cooling algorithm 1580 calculates a cooling liquid flow rate required to effect an amount of heat exchange in LTAHE 1350 to moderate a detected ambient temperature to a desired ambient temperature, which correlates to and/or determines a temperature of exhaust air generated from LTAHE 1350.

Figure 16A:
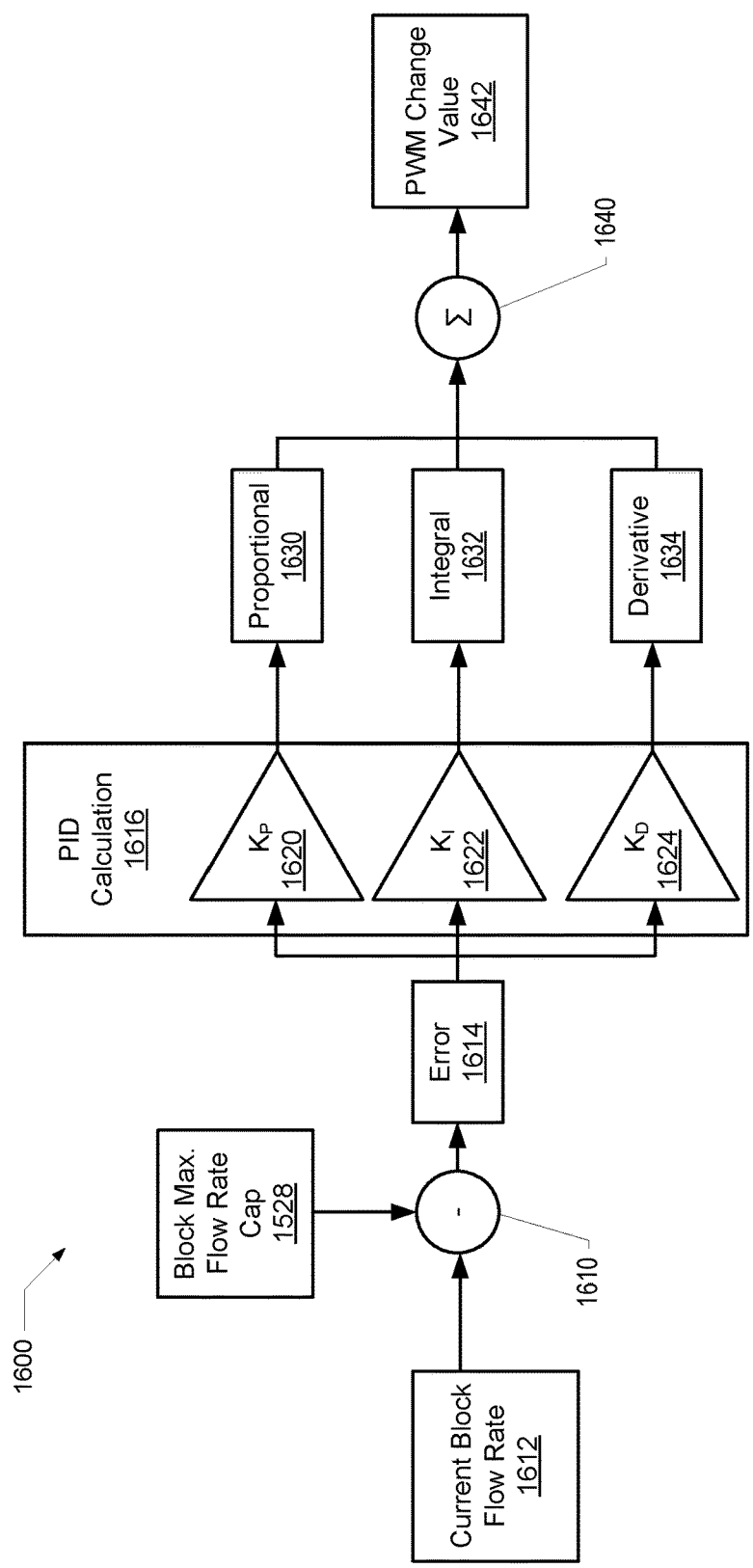
FIG. 16A is a block diagram illustrating a proportional integral and derivative (PID) control scheme utilized within liquid flow control in the RIHS to provide adjustments to a block maximum flow rate cap, in accordance with one embodiment.

FIG. 16A illustrates a first PID control loop 1600 (or first PID algorithm 1600) that is part of block flow rate algorithm 1574 (and whose resultant value is also utilized within rack flow rate algorithm 1540). According to one aspect, block flow rate algorithm 1574 is executed by each block controller in order to compute resultant values that are then forwarded to BLCB 1310 (or specifically BLC 1190). Block flow rate algorithm 1574 uses PID control loop 1600 with the current block flow rate 1612 as an input along with the block maximum flow rate cap 1528 (determined by and received from RLIC 1178) to determine the flow rate for each of the blocks 1150A-D. In one embodiment, the block maximum flow rate cap 1528 is calculated by the following equations:

Block maximum flow rate cap=Rackflow/Number of Blocks    (1)

Rackflow=(Supply Flow Rate 1520+ΣSecond Block Flow Rates 1532)/2    (2)

In another embodiment, the block maximum flow rate cap 1528 can be equal to a default value 1544 or can be manually selected by a user.

PID control loop 1600 is a control loop that continuously calculates a value, described as an "error value"," as the difference between a measured process variable and a desired set point. PID control loop 1600 determines difference 1610 as the difference between the block maximum flow rate cap 1528 and the current block flow rate 1612 as measured by flow meter 1182 for each of the blocks 1150A-D.

The resulting error value 1614 is used in PID calculation 1616 along with proportional constant (Kp) 1620, integral constant (Ki) 1622 and derivative constant (Kd) 1624. PID parameters 1542 (FIG. 15A) contain constants 1620, 1622 and 1624 for each of blocks 1150A-D. The resulting proportional value 1630, integral value 1632 and derivative value 1634 are summed 1640 to generate PWM change value 1642 that is transmitted to PWM circuit 1314 in order to generate a new PWM signal. The new PWM signal causes valve 1194 (FIG. 13) to move to a new position corresponding to PWM change value 1642.

Figure 16B:
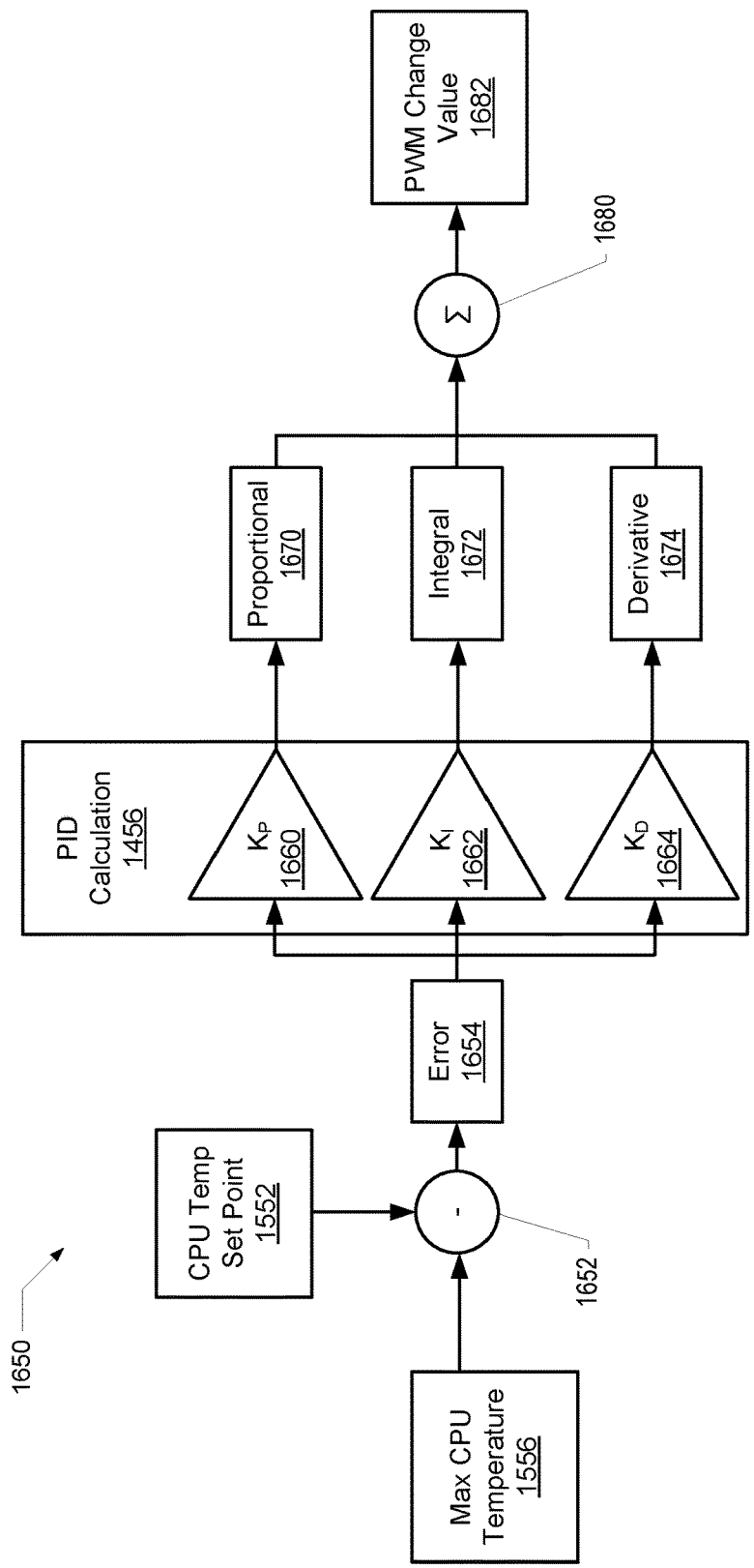
FIG. 16B is a block diagram illustrating another proportional integral and derivative (PID) control scheme, in accordance with one embodiment.

FIG. 16B illustrates second PID control loop 1650 (or second PID algorithm 1650) that is part of block flow rate algorithm 1574 (of FIG. 15B). Second PID control loop 1650 is a control loop that continuously calculates an "error value" as the difference between a measured process variable and a desired set point. Block flow rate algorithm 1574 determines a minimum flow rate for each of LC nodes 1154A-D based on the maximum CPU temperature 1556 and CPU temperature set points 1552. The maximum CPU temperature 1556 and CPU temperature set point 1552 are fed into second PID control loop 1650 in order to adjust each node input valve 934A-D in each of the LC nodes 1154A-D to maintain a relatively constant CPU temperature at the CPU temperature set point.

Block flow rate algorithm 1574 uses second PID control loop 1650 with the maximum CPU temperature 1556 and CPU temperature set points 1552 as inputs. Second PID control loop 1650 determines difference 1652 between maximum CPU temperature 1556 within each of LC nodes 1154A-D and CPU temperature set point 1552 associated with the CPU having the maximum CPU temperature. The resulting error value 1654 is used in PID calculation 1656 along with proportional constant (Kp) 1660, integral constant (Ki) 1662, and derivative constant (Kd) 1664. PID parameters 1576 (FIG. 15B) contain constants 1660, 1662, and 1664 for each of blocks 1150A-D. The resulting proportional value 1670, integral value 1672, and derivative value 1674 are summed 1680 to generate PWM change value 1682. PWM change value 1682 is transmitted from block controller to PWM circuit 1314 (FIG. 13) in order to generate new PWM signals, which causes block input valve 132 (FIG. 1) (or node input valve 934 (FIG. 9), where each block is represented as a node having a proportional valve) to move to a new position corresponding to the PWM change value 1682. Each block controller 1152 communicates with block liquid controller 1190 to similarly control the PWM circuit 1314 associated with the particular block to adjust the flow rate of cooling liquid through the nodes within the block.

In one embodiment, the above two described control loops (or generally, block valve control algorithms) operate together in an interdependent manner to effect change to the open state of the associated block valve based on the resultant values of each algorithm. Priority is assigned to a specific one of the two block valve control algorithms to effect change in the block flow rate, in part based on the resultant value of block controller's execution of first PID algorithm 1600. If the particular block is not utilizing the full complement of cooling liquid possible based on the assigned cap for that block, the RLIC receives feedback and can reduce the cap, based on the measured flow rate, and the RLIC can also reallocate flow (regained by the cap reduction) to one or more other blocks. In this instance, the resultant output of first PID algorithm 1600 would be a positive value, and the positive value operates as a trigger signal that the RLIC can reduce the assigned cap to the specific block. Second PID algorithm 1650 is then executed, but only if the measured flow rate for the particular block is less than the maximum cap algorithm. The block valve is opened only to the level calculated by second PID algorithm 1650. Whenever the resultant value of first PID algorithm 1600 is negative, then first PID algorithm 1600 is given priority to modify the PWM values sent to block valve. However, when the resultant value of first PID algorithm 1600 is positive, then second PID algorithm 1650 is given priority and becomes the controlling algorithm for modifying the PWM values sent to block valve. Thus, first PID algorithm 1600 is limited to being able to close the block valve and thus suppress the flow rate to below the established maximum cap, and first PID algorithm 1600 cannot increase the flow rate.

Figure 16C:
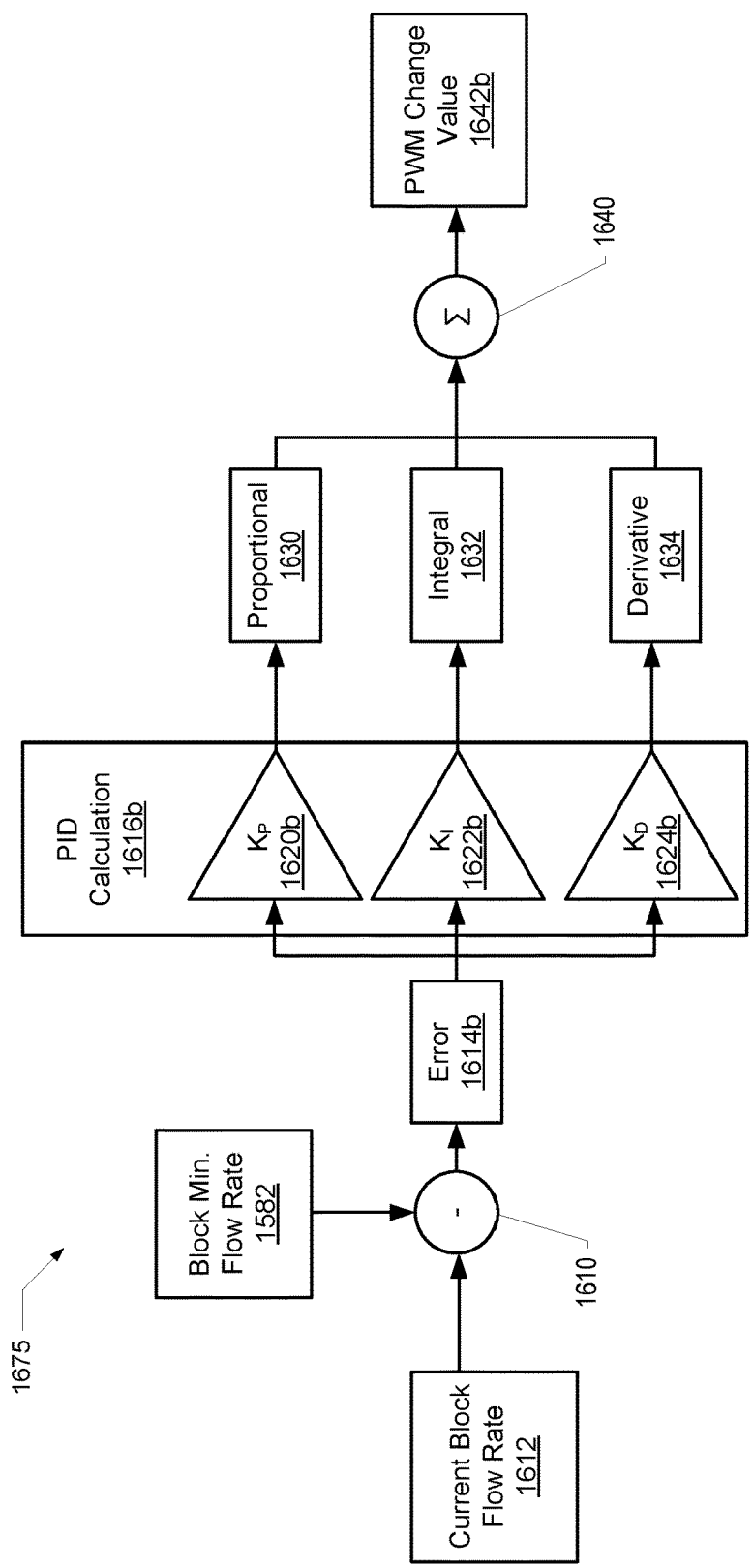
FIG. 16C illustrates an example third PID control loop 1675 that can be utilized for a block minimum flow rate calculation, in accordance with one embodiment.

In an alternate embodiment, block minimum flow rate 1582 can also be established. With this embodiment, the resultant values of the associated algorithm would be utilized solely to try to increase the block flow rate, in an opposite manner from first PID algorithm 1600. FIG. 16C illustrates an example third PID control loop 1675 that can be utilized to implement this block minimum flow rate calculation. According to one aspect, block flow rate algorithm 1574 uses third PID control loop 1675 (or third PID algorithm) with the current block flow rate 1612 as an input along with the block minimum flow rate 1582 to determine the flow rate for each of the blocks 1150A-D. In one embodiment, block minimum flow rate 1582 is calculated by RLIC or block controller 1152. In another embodiment, block minimum flow rate 1582 can be set equal to a default value 1584 or can be manually selected by a user.

It is appreciated that the entire set of values within third PID algorithm 1675 can be different from those of first PIC algorithm. These values are shown using the same reference numerals with a lower case b added as a suffix for simplicity. Functional operations and/or calculations can be similar to those involved with first PID algorithm 1600 although using different input values and PID constants. Also, when all three PID algorithms are implemented within the RIHS, priority with respect to the different algorithms can be assigned based on the resultant values of first and third PID algorithms, according to an established priority scheme.

In one embodiment, rack flow algorithm 1540, block flow rate algorithm 1574 and exhaust air cooling algorithm 1580 (further described in co-pending application Ser. No. 15/017,451) and/or resultant values generated by these algorithms are used by RLIC 1178 and by block controllers 1152 to control the overall liquid cooling and flow rates of DL RIHS 100. The exhaust air cooling algorithm calculates a cooling liquid flow rate required to effect an amount of heat exchange in ATLHE 1350 to moderate a detected ambient temperature to a desired ambient temperature, which correlates to and/or determines a temperature of exhaust air generated from ATLHE 1350. RLIC 1178 can control the overall liquid cooling of DL RIHS 100 based on a hierarchal level of priority assigned to each of the flow algorithms. Also, block controller 1152 can control the overall liquid cooling of its corresponding block based on a hierarchal level of priority assigned to each of the flow algorithms, at the block level. The rack flow algorithm 1540 can dictate the maximum or 'upper flow limit' for each individual block. Requests for negative PWM changes (reduced flow rates) from rack flow algorithm 1540 indicate the block is at or above its maximum flow limit. In a hierarchical scheme of priorities, negative PWM changes from rack flow algorithm 1540 are treated as the highest priority (priority 1 level) by RLIC 1178 and supersede the output from all other algorithms, according to one embodiment. Positive output from rack flow algorithm 1540 are lower in priority (e.g., priority 4 level) and are followed by RLIC 1778 in the absence of a higher priority request from any other algorithms such as block flow rate algorithm 1574 or an exhaust air cooling algorithm (which has a priority level of 2). The block flow rate algorithm 1574 dictates the flow rate based upon the hottest CPU temperature when the block is operating at less than the block maximum flow rate cap and above the block minimum flow rate. Requests for PWM changes by block flow rate algorithm 1574 are treated as a priority 3 level by RLIC 1778.

The minimum flow rate algorithm, when applied, can also be given priority above the other algorithms when the resultant value from the third PID algorithm is a positive. A positive result of third PID algorithm indicates that the particular block is operating with less than the desired minimum flow rate for that block. In this instance, the flow rate is adjusted upwards regardless of the cooling requirements (or lack of cooling) indicated by the second PID algorithm. Additionally, according to one embodiment, if the minimum flow rate value is larger than the maximum flow rate value or vice versa, use of the minimum flow rate in assigning the PWM value is halted to prevent the flow rate from exceeded the established maximum cap. The minimum flow rate algorithm also supersedes the exhaust air cooling algorithm, which may otherwise attempt to reduce the liquid flow to below the established minimum flow rate in situations where the ambient temperature is below the inputted desired temperature. Alternatively, in one embodiment, the exhaust air cooling algorithm can be structured to only be followed when attempting to reduce the ambient temperature.

Figure 18:
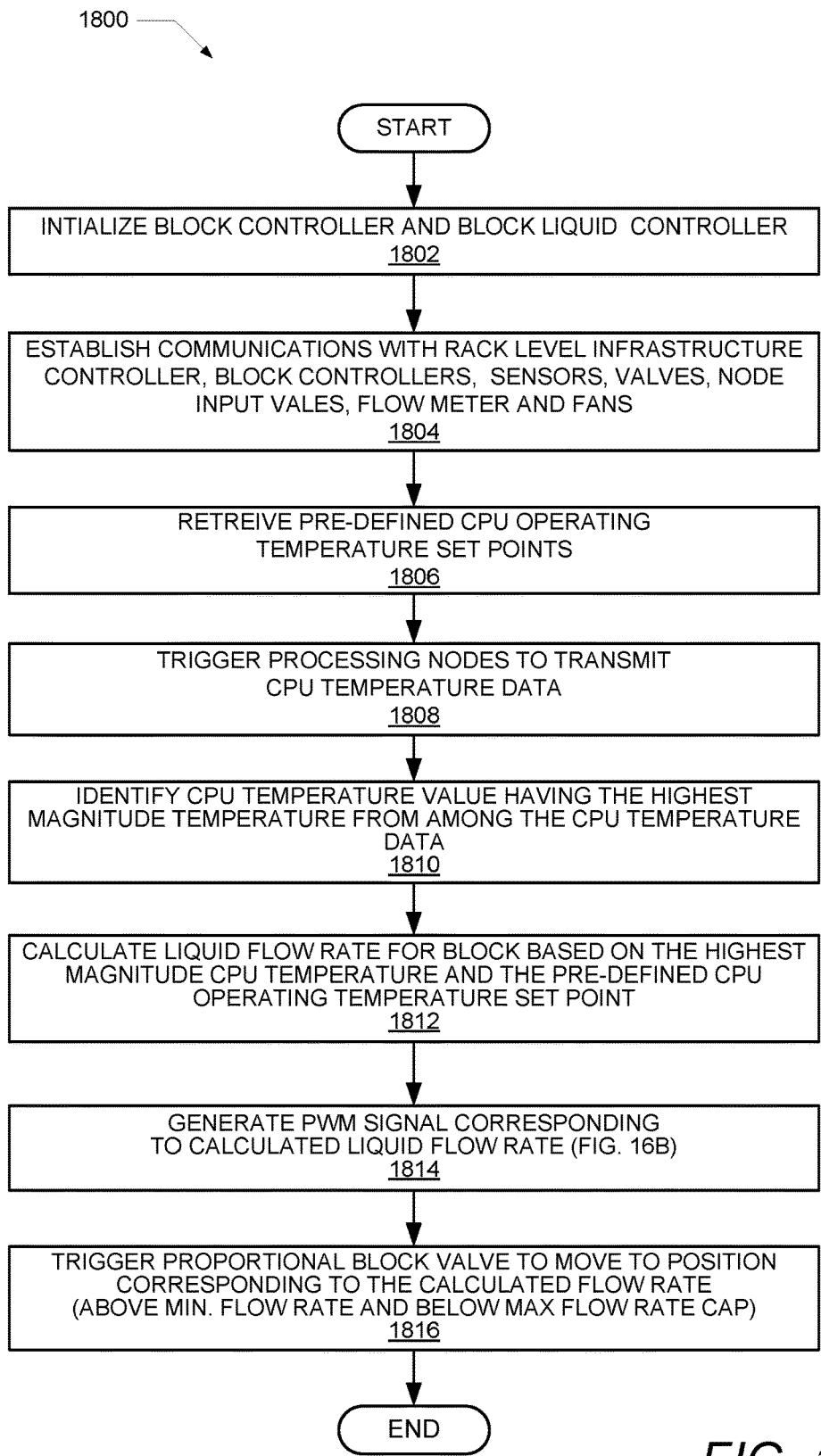
FIG. 18 is a flow chart illustrating one example of another method for controlling liquid cooling of LC nodes in a DL RIHS, according to one or more embodiments.
Figure 19:
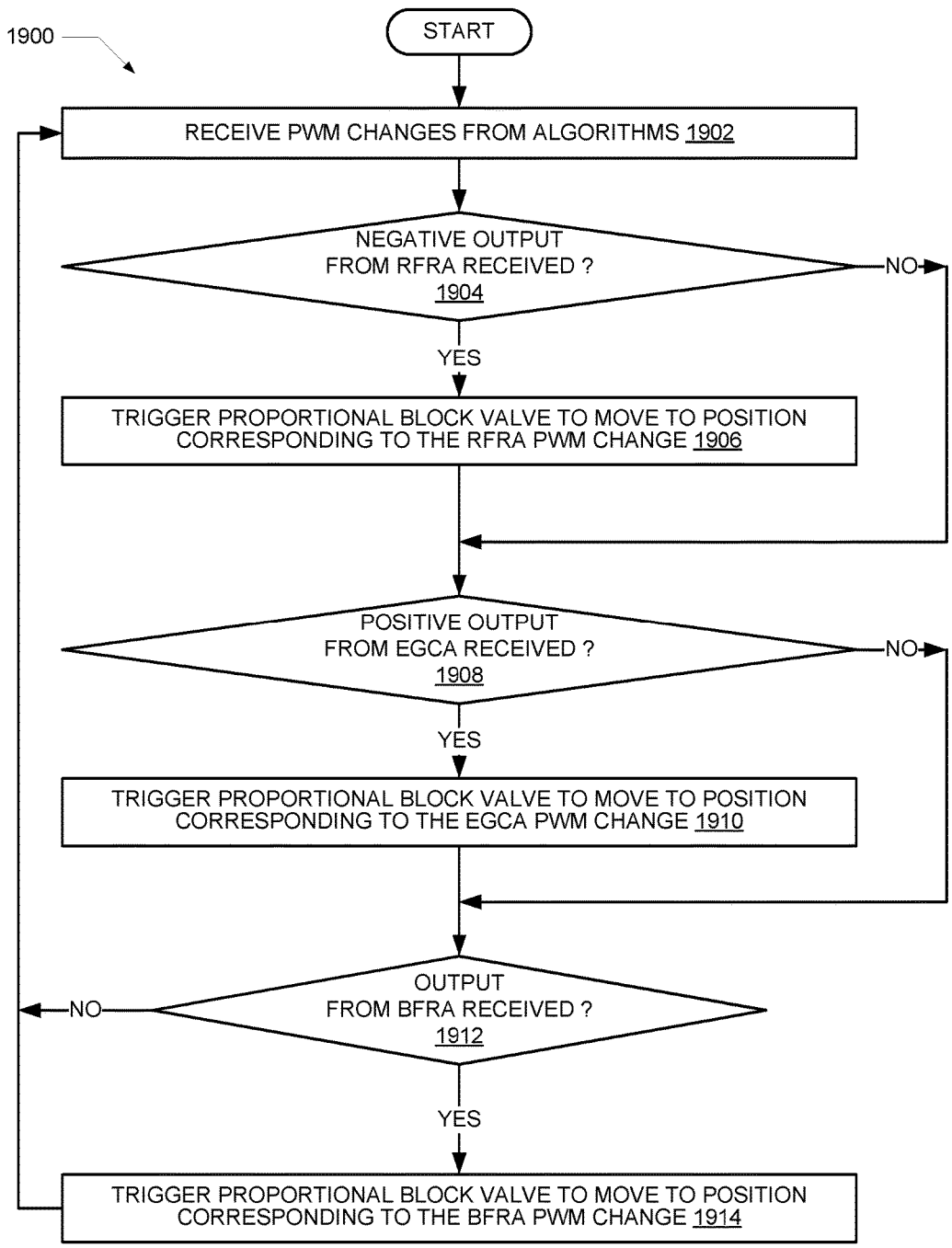
FIG. 19 is a flow chart illustrating one example of an overall hierarchal control method for controlling liquid cooling of LC nodes in a DL RIHS, according to one or more embodiments.

FIG. 17(A-B) illustrates a flowchart of an exemplary method 1700 by which RLIC 1178 within the preceding figures performs different aspects of the processes that enable the one or more embodiments of the disclosure. Specifically, method 1700 is described as being implemented via RLIC 1178 and particularly the execution of code provided by RLCC firmware 1510 within RLIC 1178, although certain aspects of method 1700 can be performed by BC 1152 in alternate embodiments. FIG. 18 illustrates a flowchart of an exemplary method 1800 by which BLC 1190 within the preceding figures performs different aspects of the processes that enable the one or more embodiments of the disclosure. Specifically, method 1800 is described as being implemented via BC 1152 and/or BLC 1190 and particularly the execution of code provided by BLCC firmware 1550 within BLC 1190. FIG. 19 illustrates a method for determining which of multiple liquid cooling algorithms is allocated priority for controlling a rate of liquid cooling of LC nodes in DL RIHS 100. Specifically, method 1900 is described as being partly performed by RLIC 1178 and primarily by BC 1152 and BLC 1190. It is however appreciated that certain aspects of the described methods may be implemented via other processing devices and/or execution of other code. Generally, methods 1700, 1800 and 1900 collectively represent computer-implemented methods. The description of each method is provided with general reference to the specific components illustrated within the preceding FIGS. 1-16B.

Figure 17A:
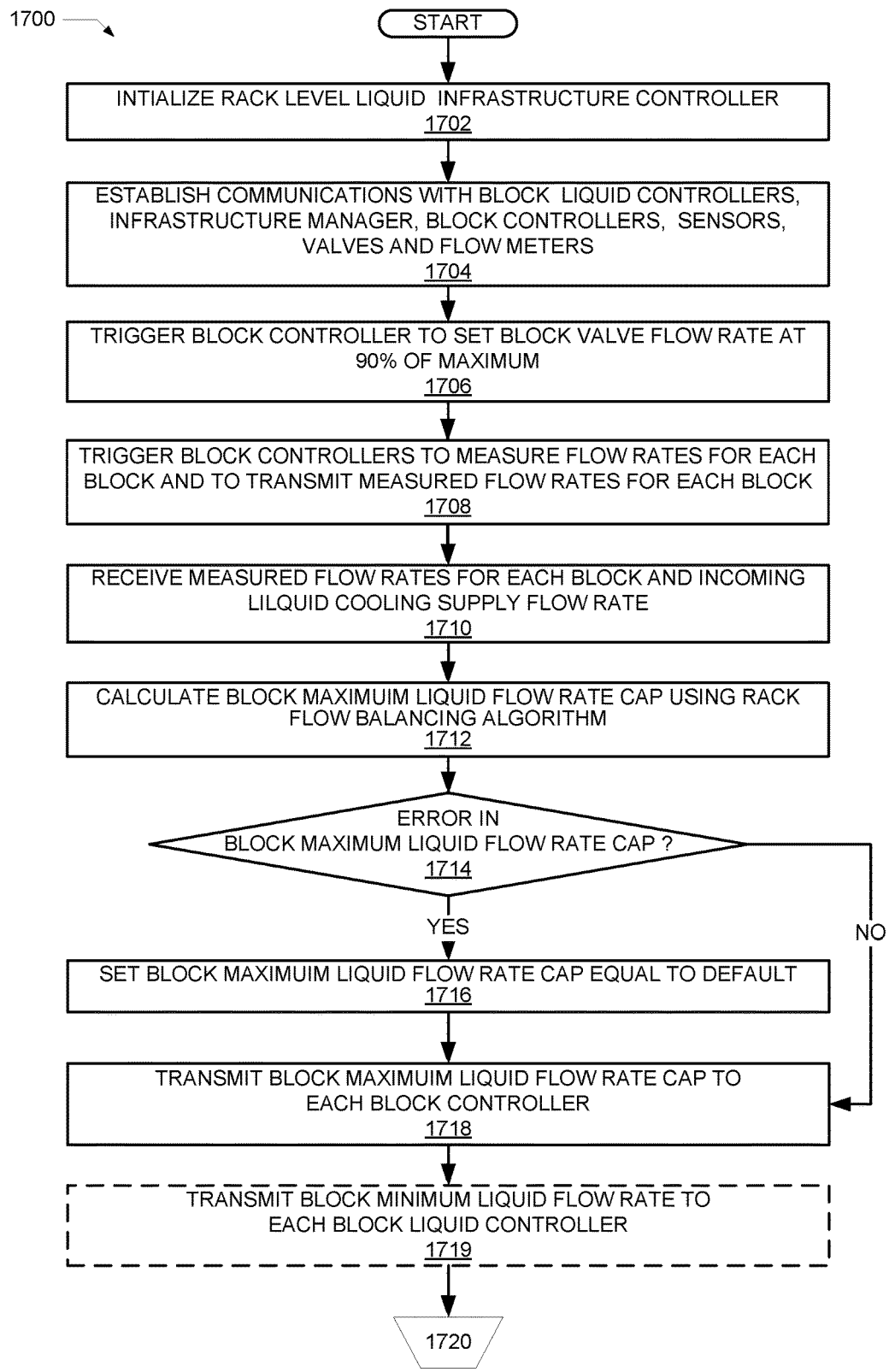
FIGS. 17A-C is a flow chart illustrating one example of a method for controlling liquid cooling of LC nodes within blocks of a DL RIHS, according to one or more embodiments.

With specific reference to FIG. 17A, method 1700 illustrates a method for controlling liquid cooling of LC nodes 1154A-D in DL RIHS 1100. Method 1700 begins at the start block and proceeds to block 1702 where RLIC 1178 is initialized. The initialization of RLIC 1178 can include RLIC 1178 loading RLCC firmware 1510, loading PID parameters 1542 and loading rack flow rate algorithms 1540. At block 1704, RLIC 1178 establishes communications with BLCs 1190, block controllers 1152A-D, IM 1130, valve 1180, sensors 1184, and flow meter 1182.

RLIC 1178 triggers each BLC 1190 to set each of their respective liquid control valves 1194 to a first flow rate 1530 that is a first percentage of a fully open block valve flow rate 1522 (block 1706). RLIC 1178 triggers each BLC 1190 to measure a second flow rate 1532 (i.e., the actual flow rate coming through the valve) via flow meter 1192 and to transmit the measured second flow rates to RLIC 1178. RLIC 1178 receives the second flow rates 1532 for each block and the incoming cooling liquid supply flow rate 1520 from flow meter 1182 (block 1710). RLIC 1178 calculates maximum flow rate caps 1528 for each of the blocks 1150A-D using rack flow rate algorithm 1540 based at least partially on the measured second flow rates 1522 and the incoming cooling liquid supply flow rate 1520 (block 1712).

RLIC 1178 determines if an error has occurred in the calculation of the maximum flow rate caps 1528 (decision block 1714). An error can be determined in the value of the maximum flow rate caps 1528 by comparing the calculated value of the flow rates caps to a range of acceptable values for the flow rate caps. In response to determining that an error has occurred in the calculation of the maximum flow rate caps 1528, RLIC 1178 sets the maximum flow rate caps 1528 to be equal to default maximum flow rate caps 1544 stored in RLIC memory 1320 (block 1716). Otherwise, in response to determining that an error has not occurred in the calculation of the maximum flow rate caps 1528, RLIC 1178 transmits the maximum flow rate caps 1528 to each of the BLCs 1190 (block 1718). According to one embodiment, which can be an optional implementation (as indicated by the dashed lines), RLIC 1178 can also transmit block liquid minimum flow rates 1582 to each block controller 1152 (block 1719). In an alternate embodiment, the block liquid minimum flow rates 1582 are established by the BC 1152 and/or pre-set by an external input.

Figure 17B:
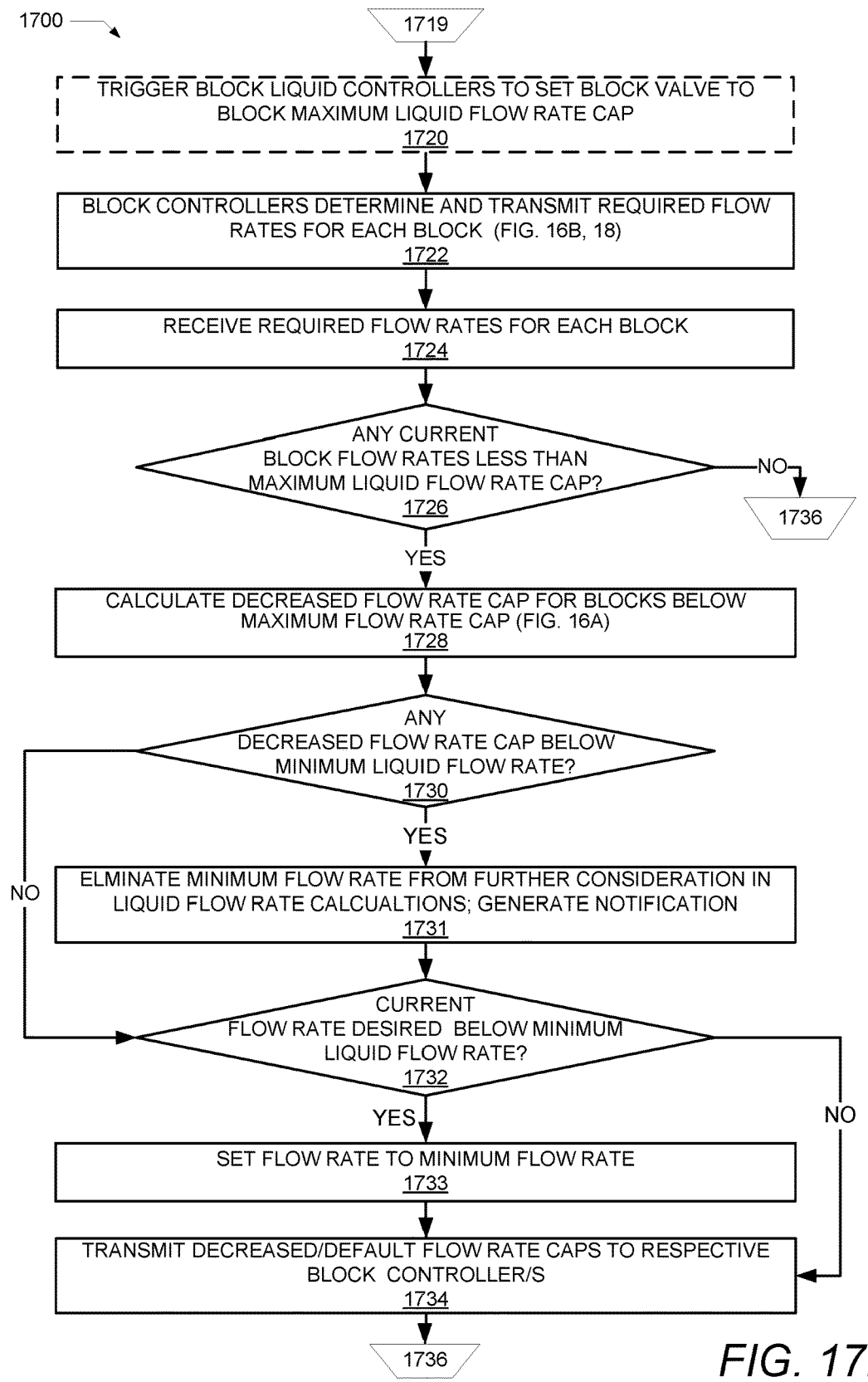

Turning to FIG. 17B, where method 1700 continues, RLIC 1178 triggers each of the BCs 1152 to signal corresponding BLCs 1190 to set their respective valves 1194 to limit the allowed flow rate through the valve 1194 to the maximum flow rate cap 1528 (block 1720). In the illustrative embodiment, RLIC 1178 triggers each BC 1152 to determine a third flow rate required for the respective block (i.e., the actual flow rate coming through the valve) and to transmit the determined third flow rates to RLIC 1178 (block 1722). RLIC 1178 receives the third flow rates 1534 required for each of the blocks (block 1724).

In one embodiment, this process is implemented by BC 1152. Thus, rather than the RLIC 1178 triggering the BCs 1152 to provide the third flow rates, RLIC 1178 can receive direct notification from the BCs 1152 of a reduced flow rate requirement or an increased flow rate requirement for the specific block. The BCs 1152 can provide this request based on a comparison of an average high temperature measurement of the CPUs and/or nodes with a respective block compared to one or more pre-established threshold temperatures, such as a CPU temperature set point for that node (see FIG. 18). For example, the BC 1152 can indicate (to the RLIC 1178) a need for a reduced flow rate if the average high temperature indicates that a third flow rate that is at or below a threshold (e.g., 80%) of the current maximum flow rate would be sufficient to provide the required cooling for all of the nodes in the particular block. As another example, BC 1152 can indicate (to the RLIC 1178) a need for an increased flow rate if the average high temperature within the nodes (e.g., CPU temperature measured by internal temperature sensors 1420, at any one recorded instant or over some determinable period, such as since a previous maximum flow rate determination cycle) is at or above a high temperature threshold (e.g., 95% of the high temperature value, indicating the need for additional cooling) for at least one CPU within the block. BC 1152 then transmits a request to RLIC 1178 for an increased cap based on the determination at BC 1152, and the request can be transmitted with or without a trigger from RLIC 1178, in alternate embodiments.

At block 1726, RLIC 1178 determines if any of the third flow rates 1534 are less than their respective maximum flow rate caps 1528. In response to determining that none of the third flow rates 1534 are less than their respective maximum flow rate caps 1528, method 1700 proceeds to block 1736. In actual implementation, the check of the third flow rate is completed periodically, such that a recursive check of the flow rates at each block is performed. In response to at least one of the third flow rates 1534 being less than its respective maximum flow rate cap 1528, RLIC 1178 can calculate a decreased flow rate cap for the corresponding blocks that have third flow rates less than their maximum flow rate cap (block 1728). At block 1730, RLIC 1178 determines if any of the decreased flow rate caps would place the flow rate below the minimum liquid flow rate 1182 for that block. If the decreased flow rate cap is below the established minimum flow rate for the block, BC and RLIC ignores the minimum flow rate altogether and continues operating without consideration for the minimum flow rate (block 1731). Otherwise, at block 1732, each BC 1152 further determines if a currently desired flow rate (e.g., proposed change in flow rate value from third PID algorithm 1675) is below the minimum liquid flow rate 1182 for the corresponding block. In response to detecting/receiving a desired change that would bring the flow rate below the minimum rate established, BC 1152 normalizes the flow rate to be equal to the minimum flow rate 1182 (block 1733). At block 1734, RLIC 1178 transmits the new decreased flow rate caps 1528 to each of the BCs 1152 whose caps can be decreased and the BCs 1152 triggers its respective BLCs 1190 to set the corresponding valve 1194 to account for the new decreased flow rate cap.

Figure 17C:
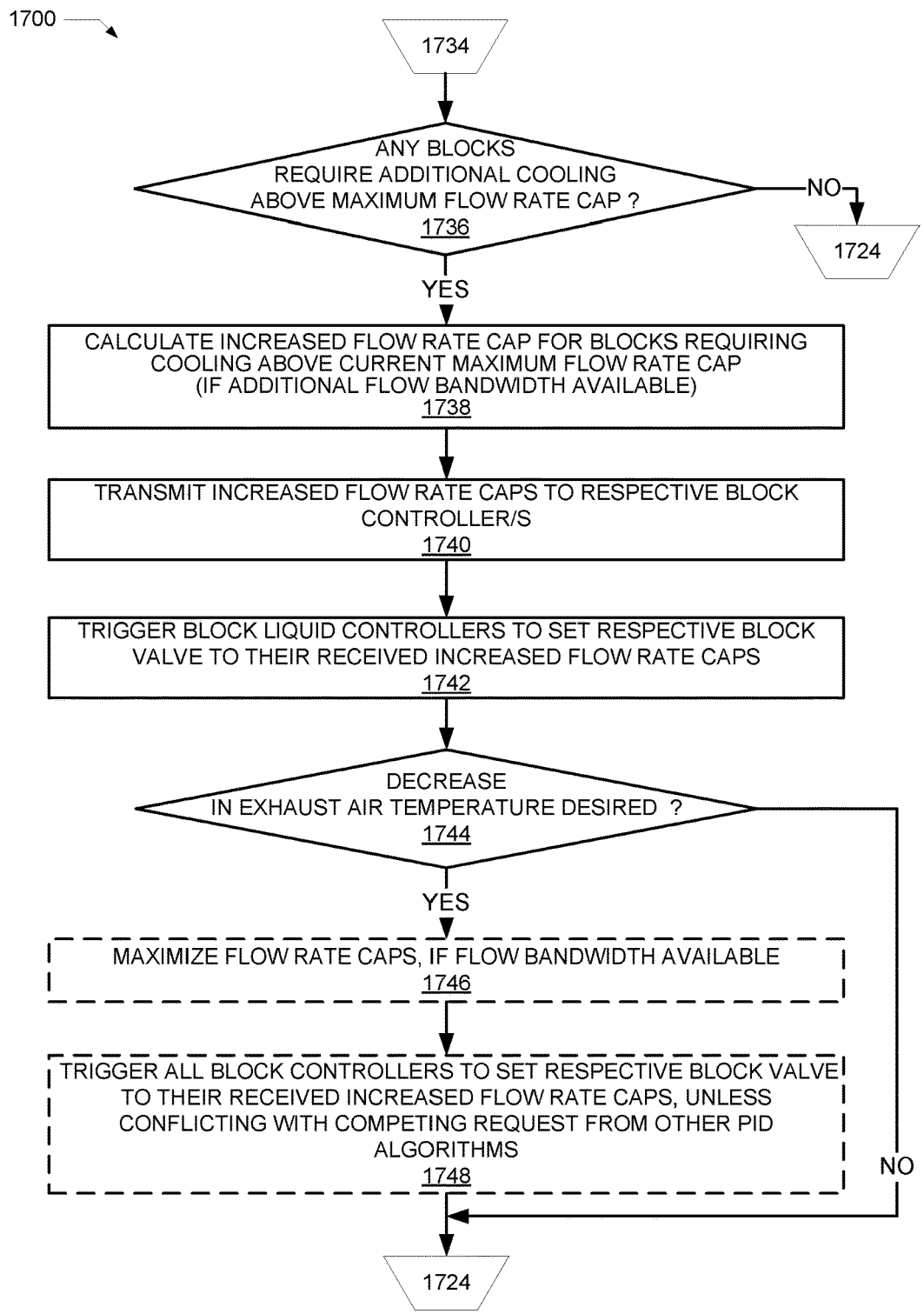

Referring to FIG. 17C, at block 1736, RLIC 1178 determines, based on received inputs from BC 1152, whether any of the blocks require additional cooling above the provided maximum flow rate cap 1528 for that block. In response to none of the blocks requiring additional cooling, method proceeds back to block 1724. In response to at least one of the blocks requiring additional cooling and assuming there is additional flow rate available (e.g., based on excess cap returned by the decreased flow rate caps in another block and/or additional flow capacity from the supply), RLIC 1178 calculates an increased flow rate cap for each of the blocks that require additional cooling (block 1738). At block 1740, RLIC 1178 transmits the new increased flow rate caps 1528 to each of the BCs 1152 whose caps can be increased. And each BCs 1152 in turn signal its corresponding BLC 1190 to set the corresponding valve 1194 to account for the new increased flow rate cap (block 1742).

At block 1744, a determination is made whether an input is received to decrease the exhaust air temperature. If no such input is received, method 1700 returns to block 1724. However, in response to a request to decrease the exhaust air temperature, RLIC 1178 signals each BC 1152, of all blocks that are not otherwise restricted, to signals BLCs 1190 to maximize their available flow rate caps (block 1748). In response to receipt of that signal, and assuming no other conflicts from any of the higher priority algorithms, BCs 1152 signals their respective BLCs 1190 to maximize the flow to reach their respective flow rate caps (block 1746).

Referring to FIG. 18, the flow chart illustrates another method 1800 for controlling liquid cooling of LC nodes 1154A-D in DL RIHS 1100. Method 1800 begins at the start block and proceeds to block 1802 where BC 1152 and BLC 1190 are initialized. The initialization of BC 1152 and BLC 1190 can include BC 1152 and/or BLC 1190 loading respective portions of BLCC firmware 1550, and BC 1152 loading PID parameters 1576 and block flow rate algorithm 1574. At block 1804, BC 1152 establishes communications with RLIC 1178, an associated BLC 1190, valve 1194, node input valves 934A-D, sensors 1196, flow meter 1192, and fans 1152.

BC 1152 retrieves pre-defined CPU operating temperature set points 1552 associated with the LC nodes 1154A-D at block 1806. BC 1152 triggers LC nodes 1154A-D to transmit CPU temperature data 1554 for each of the CPUs 1410A-D (for each node), as measured by CPU temperature sensors 1420A-D at each node (block 1808). BC 1152 identifies the highest or maximum CPU temperature 1556 from among the CPU temperature data 1554 (block 1810). BC 1190 calculates a flow rate 1558 for block 1150A using block flow rate algorithm 1574, based at least partially on the pre-defined CPU operating temperature set point 1552 and the maximum CPU temperature 1556 (block 1812). BC 1190 signals BLC 1190 to generate PWM signals corresponding to the calculated block flow rate 1558 via PWM circuit 1314 (block 1814). BLC 1190 thus triggers proportional block valve 1194 to move to a position corresponding to flow rate 1558 such that sufficient cooling liquid is provided to block 1150A and the associated LC processing nodes 1154A-D (block 1816). In one embodiment, the largest available open position of the proportional block valve, and thus the highest flow rate provided, is controlled by the maximum flow rate cap allocated by the RLIC 1178 for the block. When the calculated block flow rate exceeds the maximum flow rate cap, BLC 1190 can modulate the applied PWM signal to be the maximum flow rate cap. However, as described above in method 1700, BLC 1190 can signal the need for an increased maximum flow rate cap to the RLIC 1178. Then, in response to the RLIC 1178 allocating the required increased maximum flow rate cap, BLC 1190 forwards the full value of the PWM signal (corresponding to the calculated block flow rate) to trigger the proportional block valve 1194 to move to the required open position to support the increased maximum flow rate cap. It is appreciated that in situations where the required increased maximum flow rate cap cannot be provided to the BLC 1190 (e.g., when all blocks are utilizing their assigned maximum flow rate caps or the valve is already at its maxed open position), BC 1152 triggers/initiates throttling of the CPU(s) generating the maximum CPU temperature. This throttling is maintained, at least until additional cooling can be provided or is no longer required. Method 1800 then ends.

FIG. 19 illustrates an overall hierarchal control method for prioritizing which of several competing algorithms are allowed to make adjustments to the rate of liquid cooling of a block of LC nodes in DL RIHS 100, according to one embodiment. Method 1900 begins at the start block and proceeds to block 1902 where RLIC 1178 receives PWM change requests from rack flow rate algorithm (RFRA) 1540 (associated with flow rate cap determination and modification), block flow rate algorithm (BFRA) (associated with block level CPU temperature-based cooling adjustments) 1574 and exhaust air cooling algorithm (EACA) (for ambient air cooling) 1580. Each algorithm utilizes its own implementation of PID algorithm to yield a resultant value that can be either positive or negative. RLIC 1178 and/or BC 1152 determines if negative output from RFRA 1540 has been received (decision block 1904). In response to receiving negative output from RFRA 1540, BC 1152 triggers the proportional block valves 1194 to move to a position corresponding to the RFRA PWM change (block 1906).

In response to receiving a null or positive output (i.e., not a negative output) from RFRA 1540, BC 1152 determines if a positive output has been received from EGCA 1580 (decision block 1908). In response to receiving a positive output from EGCA 1580, BC 1152 triggers the associated proportional block valve 1194 to move to a position corresponding to the EGCA PWM change, normalized to be no greater than the established maximum flow rate cap (block 1910). Method 1900 then ends. In response to receiving a negative output (i.e., not a positive output) from EGCA 1580, BC 1152 determines if output from BFRA 1574 has been received (decision block 1912). In response to receiving output from BFRA 1574, BC 1152 triggers the proportional block valves 1194 to move to a position corresponding to the BFRA PWM change, normalized to be no greater than the established maximum flow rate cap (block 1914). In response to not receiving output from BFRA 1574 and/or following completion of any adjustments, method 1900 iterates through the series of algorithms and applies the resultant values based on the preset hierarchy/priority. It is appreciated that other functions can be performed in addition to those presented; However, the above described method 1900 is intended solely as an example and not intended to be exhaustive of all possible implementations.

In the above described flow charts of FIGS. 17-19, one or more of the methods may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A computer-implemented method for controlling liquid-based cooling of liquid-cooled (LC) nodes in a LC rack information handling system (RIHS), the method comprising:
    receiving, at a liquid cooling control subsystem, an incoming cooling liquid supply flow rate corresponding to an amount of incoming cooling liquid being supplied to the LC RIHS;
    calculating a maximum flow rate cap for each block of LC nodes;
    transmitting the maximum flow rate cap to a controller for each block of LC nodes;
    triggering the controller for each block of LC nodes to adjust an associated flow rate for that block of LC nodes to correspond to the received maximum flow rate cap for that block;
    determining if the maximum flow rate cap calculated for any one of the LC nodes is outside of a pre-determined range; and
    in response to determining that at least one of the maximum flow rate caps is outside of the pre-determined range, setting the maximum flow rate cap for each of the LC nodes to a default flow rate.

2. The method of claim 1, wherein each block of LC nodes includes at least one liquid intake control valve that controls a flow rate of incoming cooling liquid to the block of LC nodes and wherein calculating the maximum flow rate cap for each block of LC nodes comprises:
    triggering each controller to set a respective liquid control valve to a first percentage of a fully open valve position corresponding to a respective first flow rate;
    measuring a second flow rate of liquid flowing through the liquid intake control valve and transmitting the measured second flow rate to the liquid cooling control subsystem; and
    wherein calculating the maximum flow rate cap is based at least partially on the measured second flow rate and at least partially on the incoming cooling liquid supply flow rate.

3. The method of claim 2, wherein calculating the maximum flow rate cap for each of the blocks of LC nodes further comprises:
    calculating a first sum of second flow rates for all blocks of LC nodes;
    calculating an average flow rate from the first sum and the incoming cooling liquid supply flow rate; and
    calculating the maximum flow rate cap by dividing the average flow rate by a number of blocks of LC nodes within the LC RIHS.

4. The method of claim 1, wherein the liquid cooling control subsystem includes a rack-level liquid infrastructure controller (RLIC) and the controller for each block is a block liquid controller (BLC), the method further comprising:

determining, via each BLC, a third flow rate corresponding to actual cooling requirements of an associated block of LC nodes and transmitting the third flow rate to the RLIC;

determining if the third flow rate for any of the LC nodes is less than a corresponding maximum flow rate cap;

in response to determining that at least one third flow rate is less than a corresponding maximum flow rate cap, calculating a decreased flow rate cap for each block with a third flow rate that is less than a corresponding maximum flow rate cap;

transmitting the decreased maximum flow rate cap to a corresponding BLC to trigger the corresponding BLC to adjust a setting of the block valve to allow the flow rate to be reduced to at or below the decreased maximum flow rate cap.

5. The method of claim 4, further comprising:

determining, via the BLC, whether a third flow rate desired for cooling a corresponding block is greater than a current maximum flow rate cap assigned to the block;

in response to the third flow rate being greater than the current maximum flow rate cap, calculating an increased flow rate cap for the block based on one or more variables associated with operational settings of the block of LC nodes;

in response to the increased flow rate cap being available due to a decrease in a previous maximum flow rate cap of another block, transmitting the increased flow rate cap to the BLC to trigger the BLC to increase a flow rate through the block valve up to the increased flow rate cap, wherein a sum of all maximum flow caps allocated to through all blocks of the RIHS does not exceed a maximum flow of the incoming cooling liquid supply flow rate, and wherein the incoming cooling liquid supply flow is dynamically re-allocated from blocks requiring less than an allocated maximum flow rate cap to blocks requiring more than a corresponding maximum flow rate cap.

6. The method of claim 1, wherein the LC nodes are grouped into at least one block, each of the at least one blocks having an associated block liquid controller that is communicatively coupled to a rack level liquid infrastructure controller, the method further comprising:

receiving, at each of the block liquid controllers, temperature data associated with each of the LC nodes within each of the blocks;

identifying a highest magnitude temperature from among the temperature data;

retrieving a first operating temperature set point associated with the LC node having the highest magnitude temperature;

calculating a fourth flow rate for each of the at least one block based on the highest magnitude temperature value and the first operating temperature set point; and triggering each of the BLCs to move their respective liquid control valves to a first position corresponding to the fourth flow rate such that sufficient cooling liquid is provided to maintain the first operating set point for the LC nodes within each of the at least one block of the LC RIHS.

7. The method of claim 6, wherein triggering the liquid control valves to move to the first position further comprises:

generating pulse width modulated (PWM) signals that are proportional to the fourth flow rate for each of the blocks; and transmitting the PWM signals to respective liquid control valves.

8. A liquid-cooled (LC) rack information handling system (RIHS) comprising:

a rack having a plurality of LC nodes;

a liquid cooling subsystem associated with the rack, the liquid cooling subsystem including:

a first flow rate meter for measuring an incoming cooling liquid supply being supplied to the LC RIHS;

a rack level liquid infrastructure controller, the rack level liquid infrastructure controller communicatively coupled to the LC nodes and to the first flow rate meter, wherein the rack level liquid infrastructure controller:

receives an incoming cooling liquid supply flow rate corresponding to an amount of an incoming cooling liquid being supplied to the LC RIHS;

calculates a maximum flow rate cap for each of the LC nodes, wherein to calculate the maximum flow rate cap for each of the LC nodes, the rack level liquid infrastructure controller:

calculates a first sum of second flow rates for all the LC nodes;

calculates an average flow rate of the first sum and the incoming cooling liquid supply flow rate; and calculates the maximum flow rate cap by dividing the average flow rate by a number of LC nodes;

transmits the maximum flow rate cap to a controller for each of the LC nodes; and triggers the controller for each of the LC nodes to adjust an associated flow rate for that LC node to correspond to the received maximum flow rate cap for that node.

9. The liquid cooled rack information handling system of claim 8, further comprising:

at least one liquid control valve associated with each of the LC nodes that controls incoming cooling liquid to respective ones of the LC nodes; and wherein the rack level liquid infrastructure controller:

triggers each of the LC nodes to set a respective liquid control valve to a first percentage of a fully open valve position corresponding to a respective first flow rate;

triggers each of the LC nodes to measure a second flow rate of liquid flowing through the LC node and to transmit the measured second flow rate to the liquid cooling control subsystem; and wherein calculating the maximum flow rate cap is based at least partially on the measured second flow rate and at least partially on the incoming cooling liquid supply flow rate.

10. The liquid cooled rack information handling system of claim 8, wherein the rack level liquid infrastructure controller:

determines if the maximum flow rate cap calculated for any one of the LC nodes is outside of a pre-determined range; and in response to determining that at least one of the maximum flow rate caps is outside of the pre-determined range, sets the maximum flow rate cap for each of the LC nodes to a default flow rate.

11. The liquid cooled rack information handling system of claim 8, wherein the rack level liquid infrastructure controller:
  triggers each of the LC nodes to measure a third flow rate through each of their respective LC nodes and to transmit the measured third flow rates to the rack level liquid infrastructure controller;
  determines if the third flow rate for each of the LC nodes is less than their corresponding maximum flow rate cap;
  in response to determining that at least one third flow rate is less than their corresponding maximum flow rate cap, calculates a decreased flow rate cap for the LC nodes that have a third flow rate less than their corresponding maximum flow rate cap and calculating an increased flow rate cap for each of the LC nodes that have third flow rates greater than their corresponding maximum flow rate cap, wherein the total maximum flow rate caps for the LC nodes are less than the incoming cooling liquid supply flow rate for the LC RIHS;
  transmits respective decreased flow rate caps and respective increased flow rate caps to each of the corresponding LC nodes; and
  triggers the corresponding LC nodes to adjust each of their respective flow rates to correspond to the received flow rate caps, wherein the incoming cooling liquid supply flow is re-allocated from LC nodes that require less than their corresponding maximum flow rate cap to LC nodes that require more than their corresponding maximum flow rate cap.

12. The liquid cooled rack information handling system of claim 8, wherein the LC nodes are grouped into at least one block, each of the at least one blocks having an associated block liquid controller that is communicatively coupled to the rack level liquid infrastructure controller and wherein each of the block liquid controllers:
  receives temperature data associated with each of the LC nodes within each of the blocks;
  identifies a highest magnitude temperature from among the temperature data;
  retrieves a first operating temperature set point associated with the LC node having the highest magnitude temperature;
  calculates a fourth flow rate for each of the at least one block based on the highest magnitude temperature value and the first operating temperature set point; and
  triggers each of the LC nodes to move their respective liquid control valves to a first position corresponding to the fourth flow rate such that sufficient cooling liquid is provided to each of the LC nodes within each of the at least one block of the LC RIHS.

13. The liquid cooled rack information handling system of claim 12, wherein to trigger the liquid control valves to move to the first position the block liquid controller:
  generates pulse width modulated (PWM) signals that are proportional to the fourth flow rate for each of the blocks; and
  transmits the PWM signals to respective liquid control valves.

14. A liquid cooling system for a liquid cooled (LC) rack information handling system (RIHS) comprising:
  a liquid cooling subsystem including a first flow rate meter for measuring an incoming cooling liquid supply being supplied to the LC RIHS and a rack level liquid infrastructure controller, the rack level liquid infrastructure controller communicatively coupled to the first flow rate meter, wherein the rack level liquid infrastructure controller:
    receives an incoming cooling liquid supply flow rate corresponding to an amount of an incoming cooling liquid being supplied to the LC RIHS;
    calculates a maximum flow rate cap for each of a plurality of LC nodes, wherein to calculate the maximum flow rate cap for each of the LC nodes, the rack level liquid infrastructure controller:
      calculates a first sum of second flow rates for all the LC nodes;
      calculates an average flow rate of the first sum and the incoming cooling liquid supply flow rate; and
      calculates the maximum flow rate cap by dividing the average flow rate by a number of LC nodes;
    transmits the maximum flow rate cap to a controller for each of the LC nodes; and
    triggers the controller for each of the LC nodes to adjust an associated flow rate for that LC node to correspond to the received maximum flow rate cap for that node.

15. The liquid cooling system of claim 14, further comprising:
  at least one liquid control valve associated with each of the LC nodes that controls incoming cooling liquid to respective ones of the LC nodes; and
  wherein the firmware further configures the rack level liquid infrastructure controller to:
    trigger each of the LC nodes to set a respective liquid control valve to a first percentage of a fully open valve position corresponding to a respective first flow rate;
    trigger each of the LC nodes to measure a second flow rate of liquid flowing through the LC node and to transmit the measured second flow rate to the liquid cooling control subsystem; and
  wherein calculating the maximum flow rate cap is based at least partially on the measured second flow rate and at least partially on the incoming cooling liquid supply flow rate.

16. The liquid cooled rack information handling system of claim 14, wherein the firmware further configures the rack level liquid infrastructure controller to:
  determine if the maximum flow rate cap calculated for any one of the LC nodes is outside of a pre-determined range; and
  in response to determining that at least one of the maximum flow rate caps is outside of the pre-determined range, set the maximum flow rate cap for each of the LC nodes to a default flow rate.

17. The liquid cooled rack information handling system of claim 14, wherein the firmware further configures the rack level liquid infrastructure controller to:
  trigger each of the LC nodes to measure a third flow rate through each of their respective LC nodes and to transmit the measured third flow rates to the rack level liquid infrastructure controller;
  determine if the third flow rate for each of the LC nodes is less than their corresponding maximum flow rate cap;
  in response to determining that at least one of the third flow rates is less than their corresponding maximum flow rate cap, calculate a decreased flow rate cap for the LC nodes that have a third flow rate less than their corresponding maximum flow rate cap and calculating an increased flow rate cap for each of the LC nodes that have third flow rates greater than their corresponding maximum flow rate cap, wherein the total maximum flow rate caps for the LC nodes are less than the incoming cooling liquid supply flow rate for the LC RIHS;

transmit respective decreased flow rate caps and respective increased low rate caps to each of the corresponding LC nodes; and trigger the corresponding LC nodes to adjust each of their respective flow rates to correspond to the received flow rate caps, wherein the incoming cooling liquid supply flow is re-allocated from LC nodes that require less than their corresponding maximum flow rate cap to LC nodes that require more than their corresponding maximum flow rate cap.

18. The liquid cooled rack information handling system of claim 14, wherein the LC nodes are grouped into at least one block, each of the at least one blocks having an associated block liquid controller that is communicatively coupled to the rack level liquid infrastructure controller and wherein each of the block liquid controllers have firmware executing thereon that configures the block liquid controller to:

receive temperature data associated with each of the LC nodes within each of the blocks;

identify a highest magnitude temperature from among the temperature data;

retrieve a first operating temperature set point associated with the LC node having the highest magnitude temperature;

calculate a fourth flow rate for each of the at least one block based on the highest magnitude temperature value and the first operating temperature set point; and trigger each of the LC nodes to move their respective liquid control valves to a first position corresponding to the fourth flow rate such that sufficient cooling liquid is provided to each of the LC nodes within each of the at least one block of the LC RIHS.

* * * * *